(12) United States Patent
Hashimoto

(10) Patent No.: US 9,843,161 B2
(45) Date of Patent: Dec. 12, 2017

(54) QUANTUM CASCADE LASER

(71) Applicant: SUMITOMO ELECTRIC INDUSTRIES, LTD., Osaka (JP)

(72) Inventor: Jun-ichi Hashimoto, Chigasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 244 days.

(21) Appl. No.: 14/865,245

(22) Filed: Sep. 25, 2015

(65) Prior Publication Data
US 2017/0244222 A1    Aug. 24, 2017

(30) Foreign Application Priority Data
Sep. 26, 2014   (JP) .................... 2014-197262

(51) Int. Cl.
  *H01S 5/125*   (2006.01)
  *H01S 5/187*   (2006.01)
  *H01S 5/34*    (2006.01)

(52) U.S. Cl.
  CPC ............ *H01S 5/3401* (2013.01); *H01S 5/125* (2013.01)

(58) Field of Classification Search
  CPC ............................ H01S 5/3401; H01S 5/0268
  USPC ................................................. 372/45.012
  See application file for complete search history.

(56) References Cited

U.S. PATENT DOCUMENTS

| 9,300,115 B2 * | 3/2016 | Tsuji ................... H01S 5/3402 |
| 2003/0231686 A1 | 12/2003 | Liu | |
| 2008/0192794 A1 * | 8/2008 | Hammer ............... H01S 5/0265 372/96 |

OTHER PUBLICATIONS

M. M. Raj et al., Highly Uniform 1.5 μm Wavelength Deeply Etched Semiconductor/Benzocylobutene Distributed Bragg Reflector Lasers, Jpn. J. Appl. Phys., vol. 39, pp. L 1297-L 1299 (2000).
S. Golka et al., "GaAs/AlGaAs quantum cascade lasers with dry etched semiconductor-air Bragg reflectors", Journal of Modern Optics, vol. 52, No. 16, pp. 2303-2308, (2005).
M. Ariga et al., "Low Threshold GaInAsP Lasers with Semiconductor/Air Distributed Bragg Reflector Fabricated by inductively Coupled Plasma Etching", Jpn. J. Appl. Phys., vol. 39, pp. 3406-3409, (2000).

(Continued)

*Primary Examiner* — Tuan Nguyen
(74) *Attorney, Agent, or Firm* — Smith, Gambrell & Russell, LLP

(57) ABSTRACT

A quantum cascade laser includes a substrate including first and second regions arranged along a first axis; a stacked semiconductor layer disposed in the second region, the stacked semiconductor layer having an end facet located on a boundary between the first and second regions, the stacked semiconductor layer including a core layer and a cladding layer that are exposed at the end facet thereof; and a distributed Bragg reflection structure disposed in the first region, the distributed Bragg reflection structure including a semiconductor wall and a covering semiconductor wall that covers the end facet of the stacked semiconductor layer. The semiconductor wall and the covering semiconductor wall are made of a single semiconductor material. The semiconductor wall provides first and second side surfaces. The covering semiconductor wall provides an end facet that is located away from the first and second side surfaces of the semiconductor wall.

14 Claims, 19 Drawing Sheets

(56) References Cited

OTHER PUBLICATIONS

M. M. Raj et al., "Highly Uniform 1.5 μm Wavelength Deeply Etched Semiconductor/ Benzocyclobutene Distributed Bragg Reflector Lasers", Jpn. J. Appl. Phys., vol. 39, pp. L 1297-L 1299 (2000).
Office Action dated Jun. 27, 2016 in U.S. Appl. No. 14/865,296.

* cited by examiner

FIG. 3A
| DBR structure | WL (μm) | WH2 (μm) |
|---|---|---|
| λ/(4×n) structure | 1.885 | 0.6085 |
| 3×λ/(4×n) structure | 5.655 | 1.8255 |
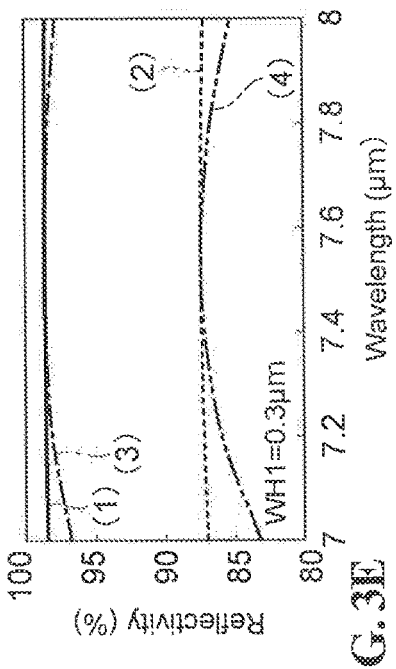
FIG. 3B
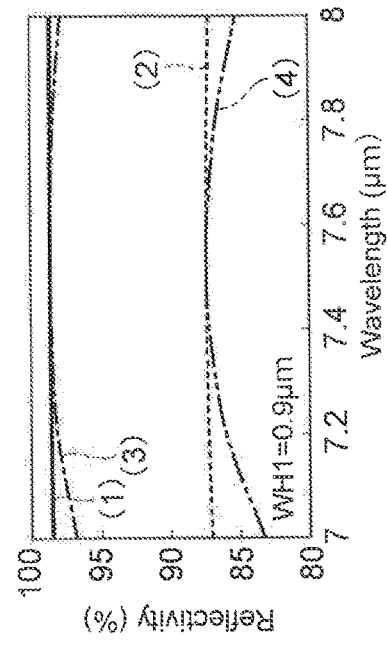
FIG. 3C
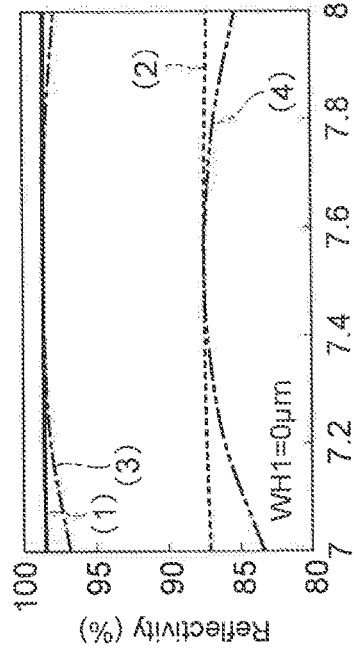
FIG. 3D
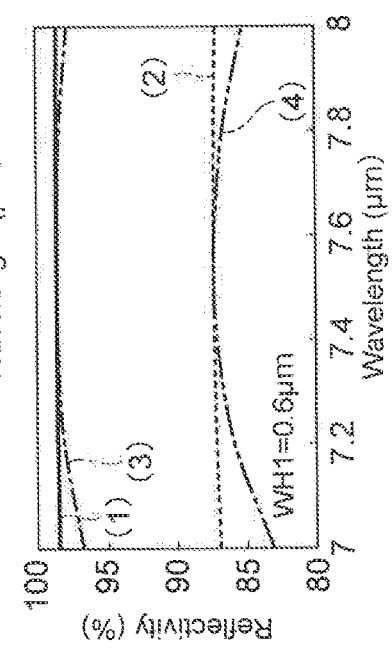
FIG. 3E

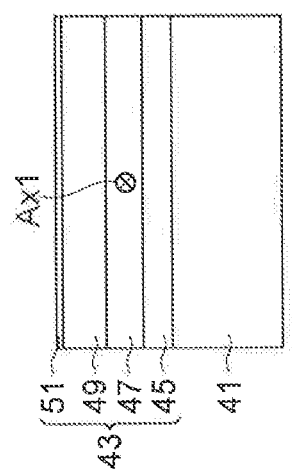
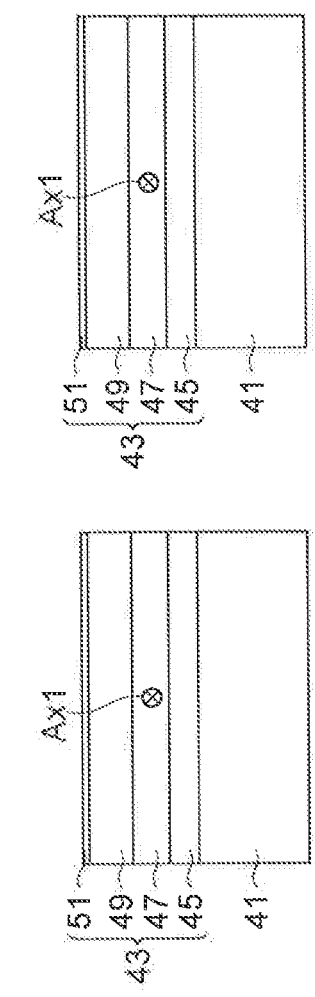
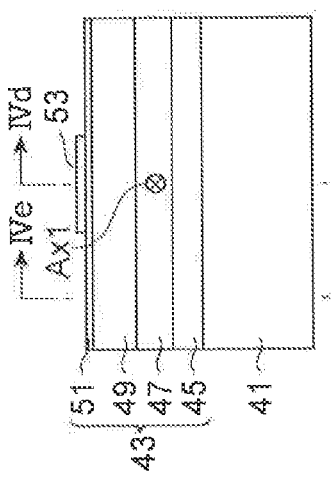
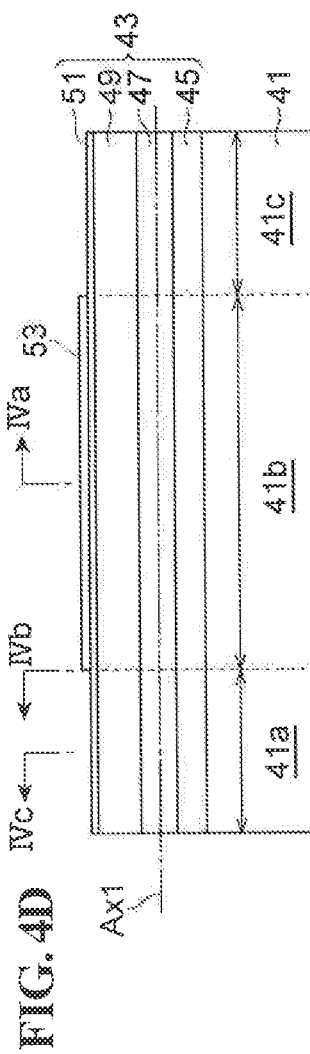
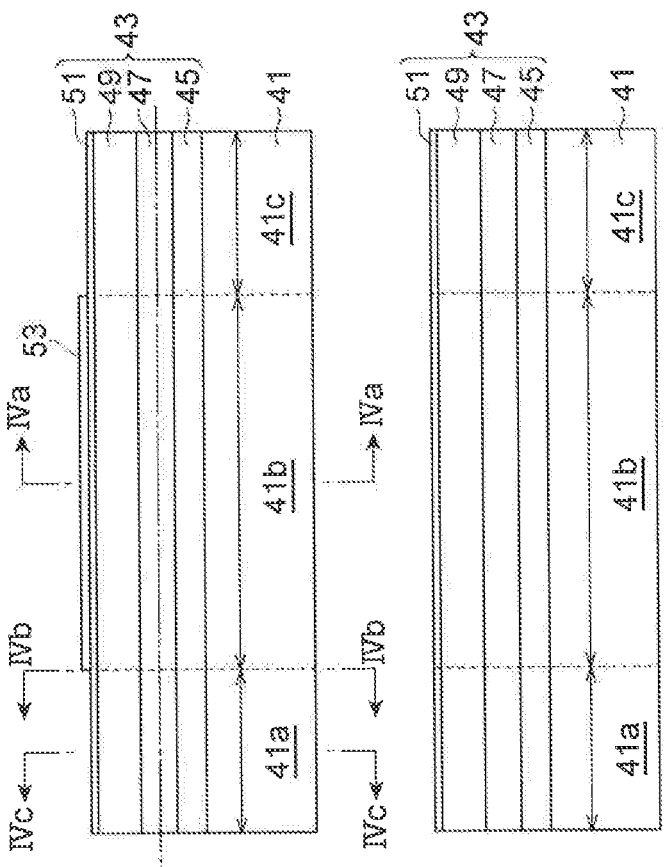

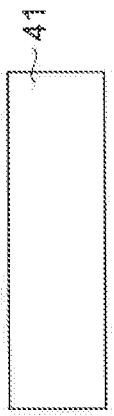
FIG. 5A
FIG. 5B
FIG. 5C
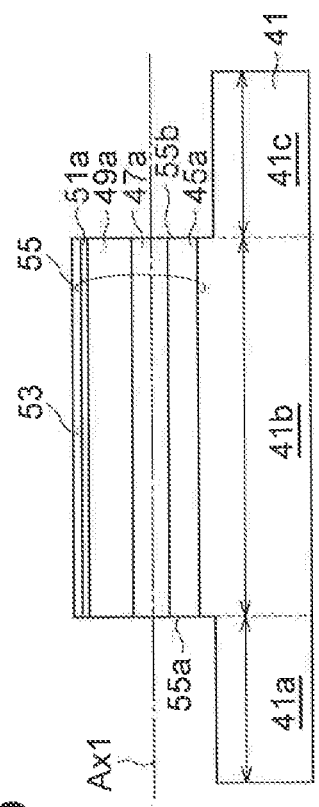
FIG. 5D
FIG. 5E

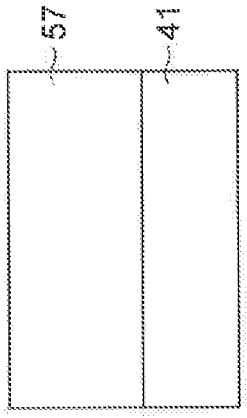
FIG. 6A
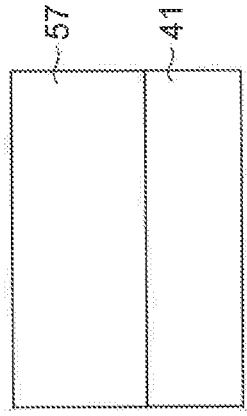
FIG. 6B
FIG. 6C
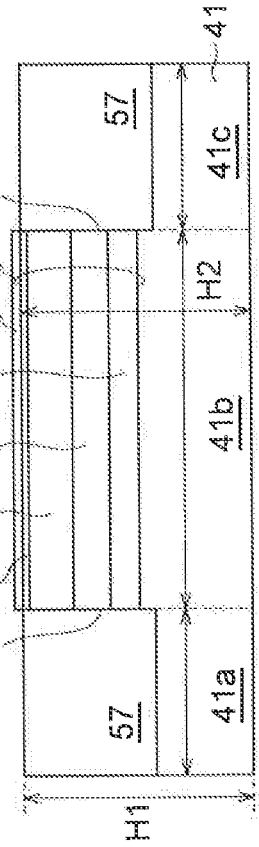
FIG. 6D
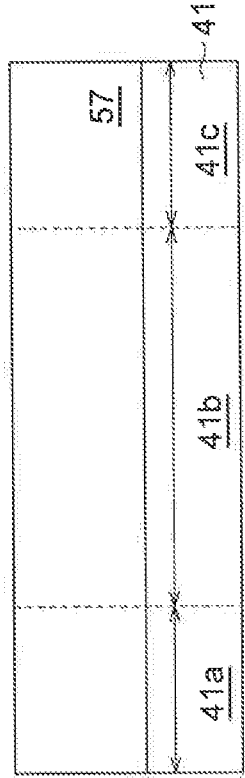
FIG. 6E

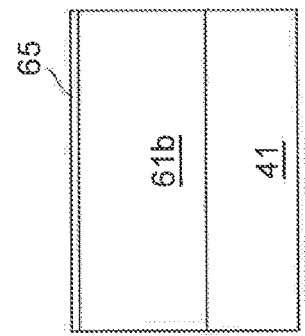
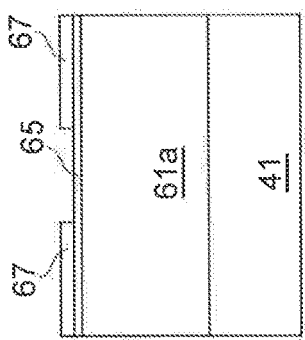
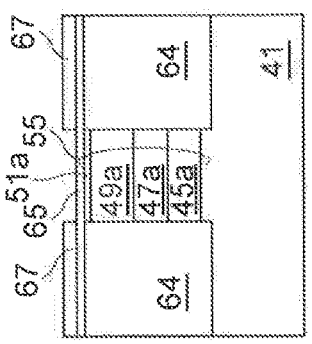
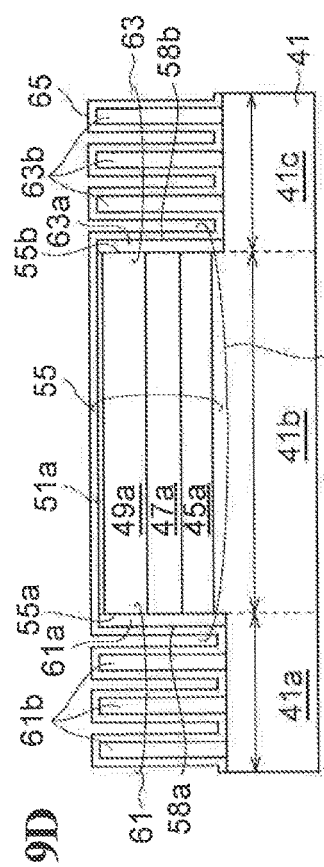
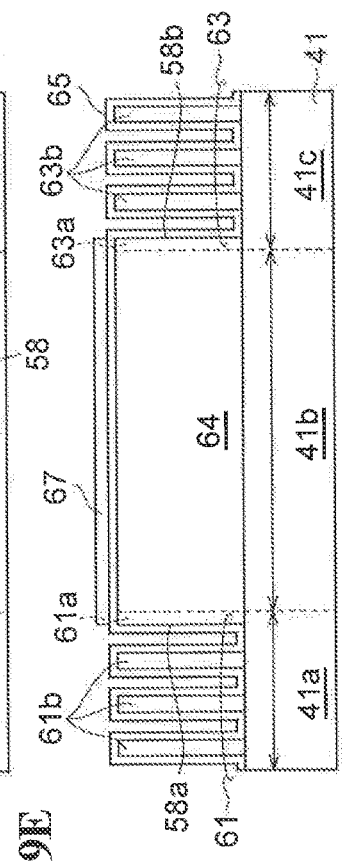

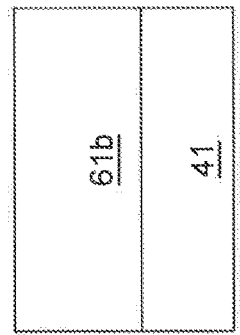
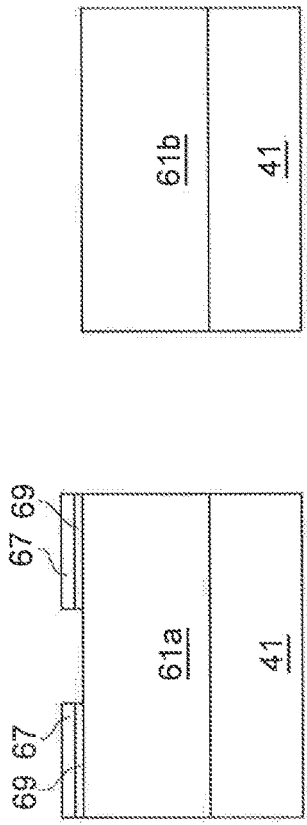
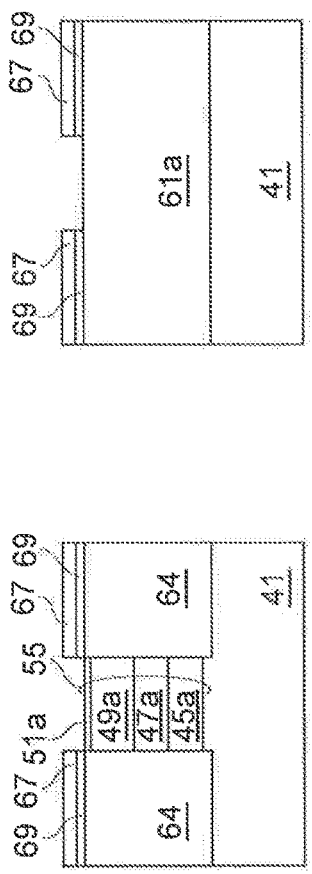
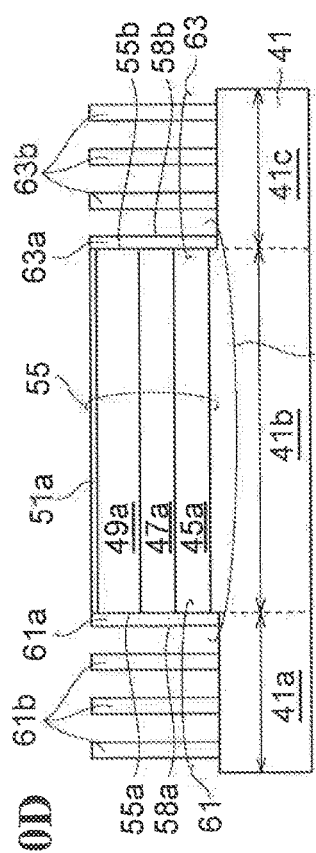
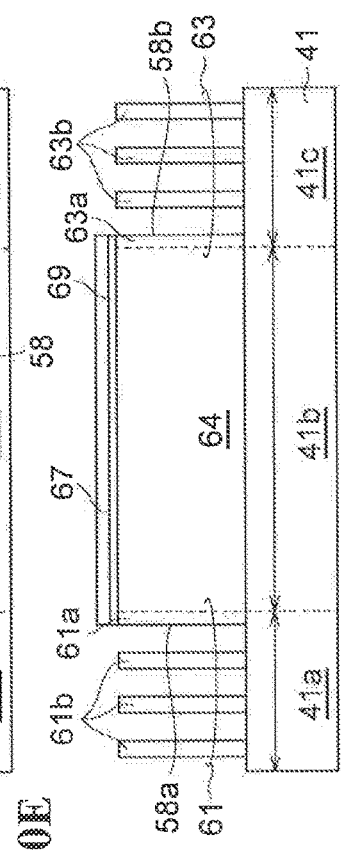

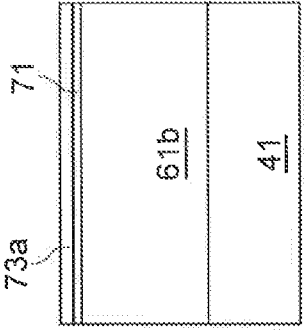
FIG. 11A
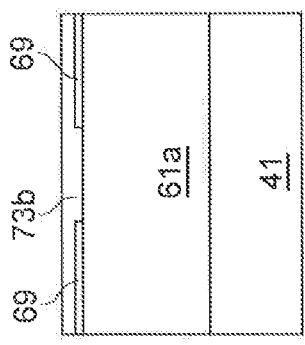
FIG. 11B
FIG. 11C
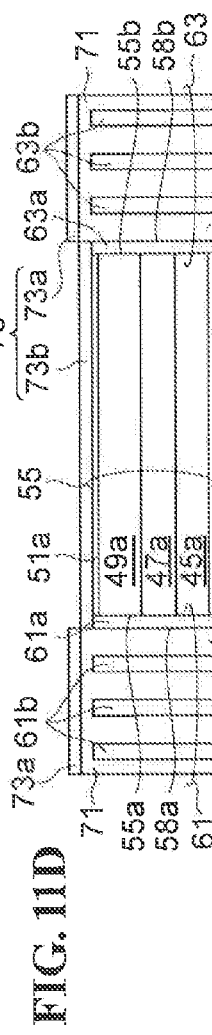
FIG. 11D
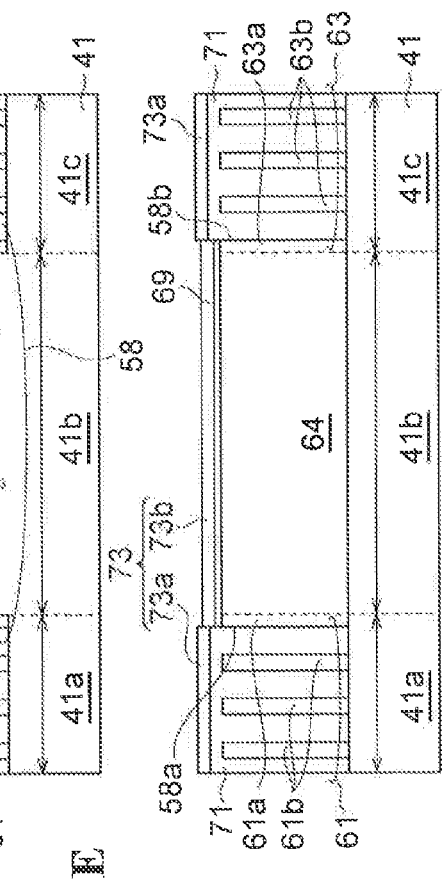
FIG. 11E

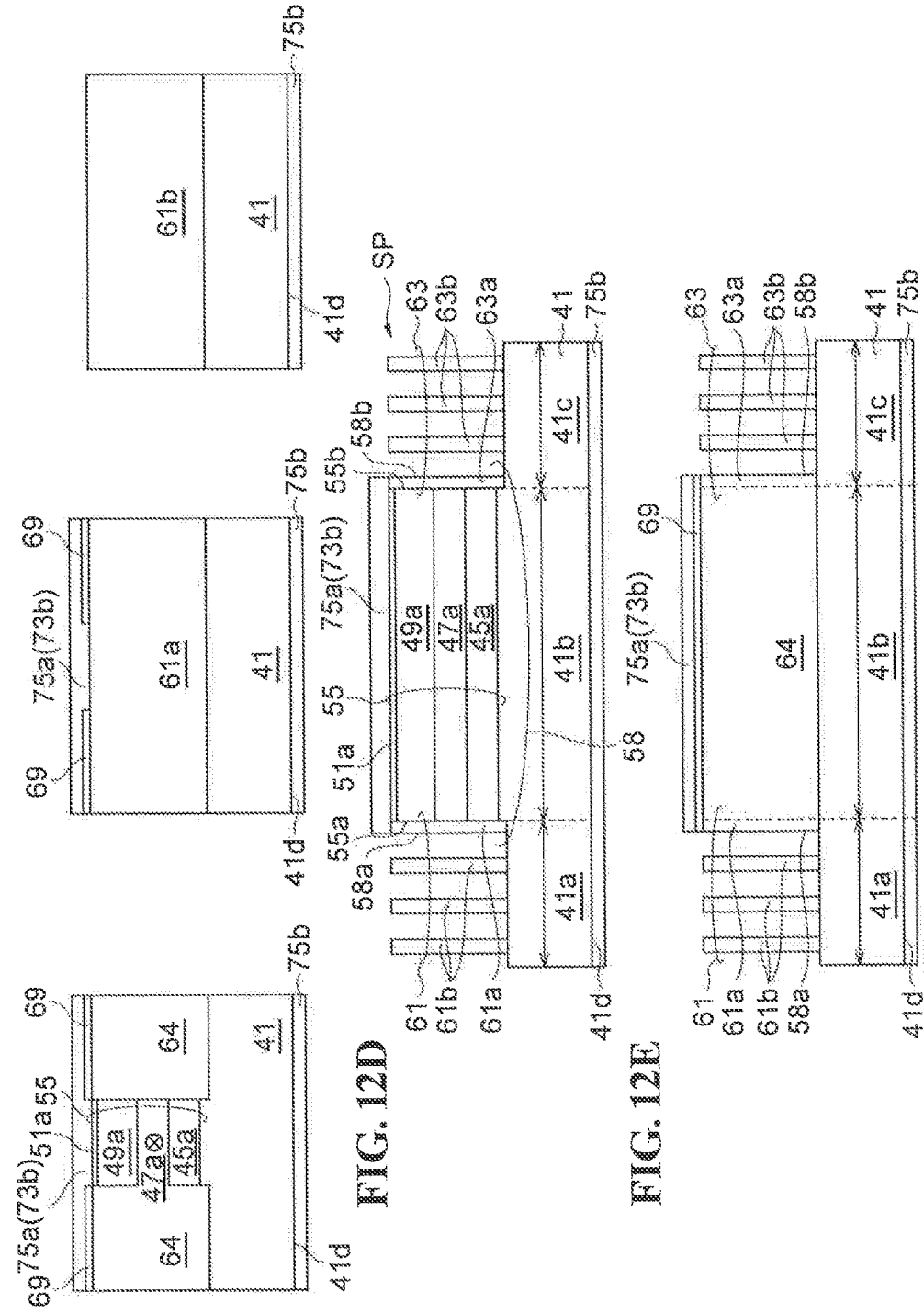

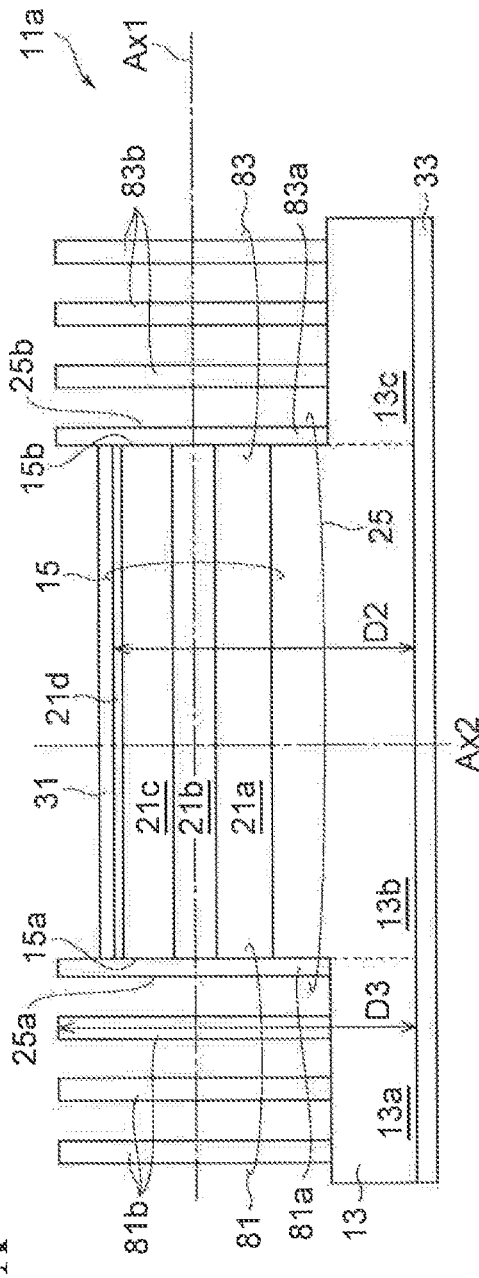
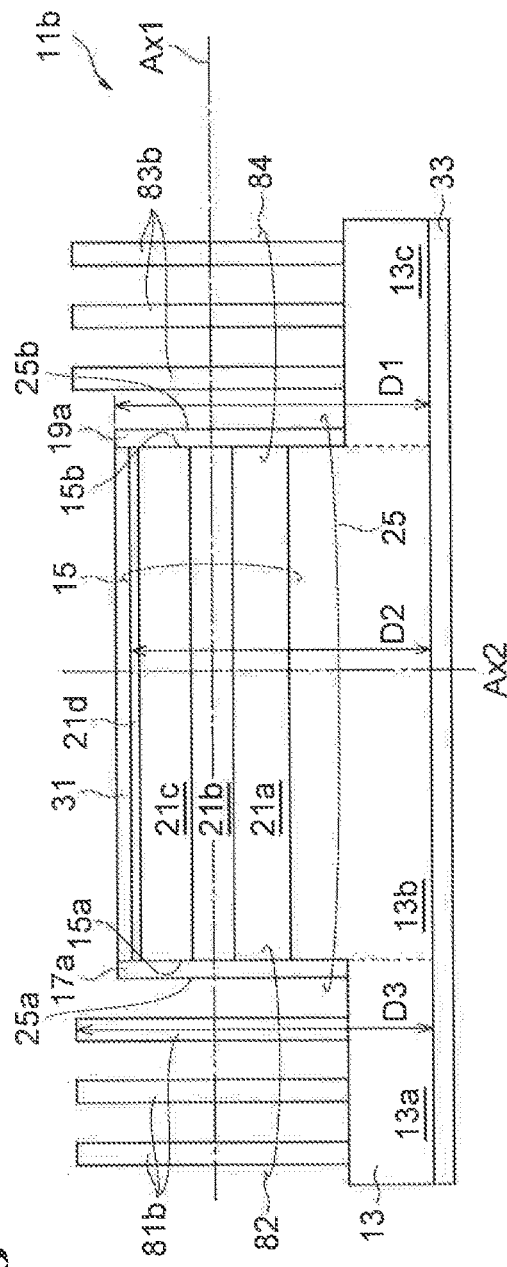
FIG. 13A
FIG. 13B

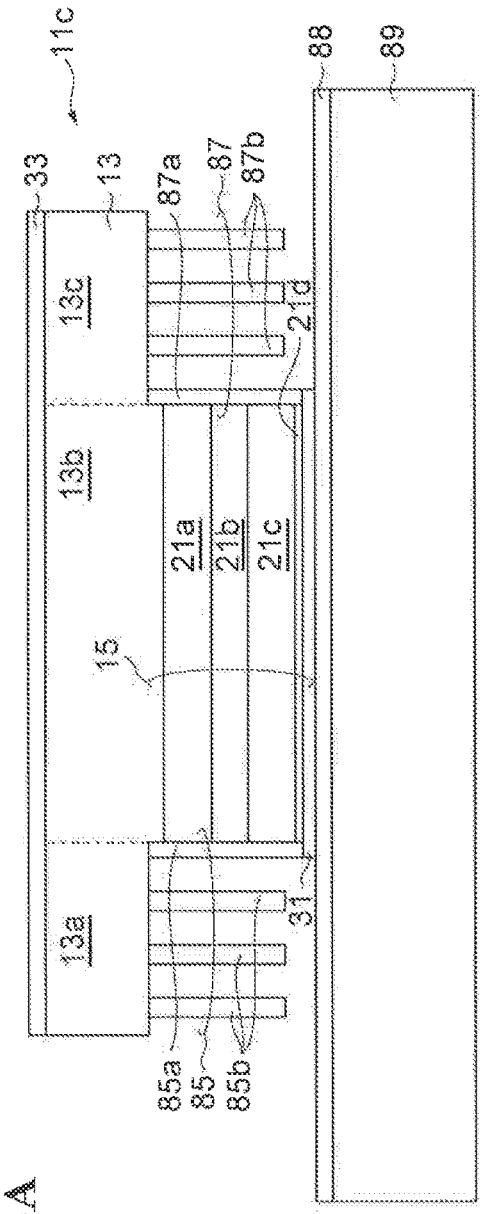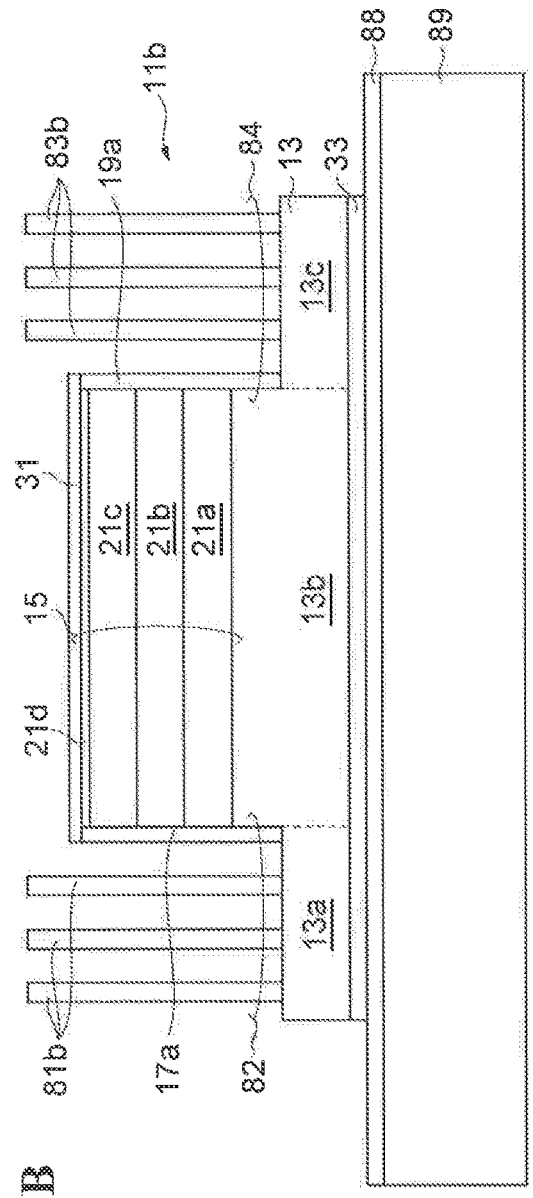
FIG. 15A
FIG. 15B

QUANTUM CASCADE LASER

BACKGROUND OF THE INVENTION

1. Field of the Invention

The present invention relates to a quantum cascade laser.

2. Description of the Related Art

Jpn. J. Appl. Phys., vol. 39, pp. L1297-1299, 2000 (Non-Patent Document 1), Journal of Modern Optics, vol. 52, No. 16, pp. 2303-2308, 2005 (Non-Patent Document 2), and Jpn. J. Appl. Phys., vol. 39, pp. 3406-3409, 2000 (Non-Patent Document 3) disclose quantum cascade lasers. In particular, Non-Patent Document 2 discloses a quantum cascade laser (QCL) including a mesa waveguide and a distributed Bragg reflector constituted by semiconductor/air. The distributed Bragg reflector reflects light emitted from the mesa waveguide.

SUMMARY OF THE INVENTION

In the production of the quantum cascade laser (QCL) including the distributed Bragg reflector as disclosed in Non-Patent Document 2, first, a stacked semiconductor layer for forming a mesa waveguide and a distributed Bragg reflector is grown on a substrate. Subsequently, the stacked semiconductor layer is etched to form the distributed Bragg reflector and the mesa waveguide, simultaneously. The stacked semiconductor layer includes a plurality of semiconductor layers. When the stacked semiconductor layer is etched, the planarity and verticality of the side surfaces of the distributed Bragg reflector deteriorate due to the difference of etching rates of the semiconductor layers constituting the distributed Bragg reflector.

A quantum cascade laser according to one aspect of the present invention includes a substrate having a principal surface, the substrate including a first region and a second region arranged along a first axis; a stacked semiconductor layer disposed on the principal surface in the second region of the substrate, the stacked semiconductor layer having an end facet located on a boundary between the first region and the second region of the substrate, the stacked semiconductor layer including a core layer and a cladding layer disposed on the core layer, the core layer and the cladding layer being exposed at the end facet of the stacked semiconductor layer; and a distributed Bragg reflection structure disposed on the principal surface in the first region of the substrate, the distributed Bragg reflection structure including a semiconductor wall and a covering semiconductor wall that covers the end facet of the stacked semiconductor layer, the distributed Bragg reflection structure being optically coupled to the end facet of the stacked semiconductor layer. The semiconductor wall and the covering semiconductor wall are made of a single semiconductor material. The semiconductor wall has a first side surface and a second side surface opposite to the first side surface. The first side surface and the second side surface intersect the first axis and extend along a second axis intersecting the principal surface. The covering semiconductor wall has an end facet that intersects the first axis and extends along the second axis. In addition, the end facet of the covering semiconductor wall is located away from the first side surface and the second side surface of the semiconductor wall.

Objects, features, and advantages according to embodiments of the present invention will be more easily understood from the following detailed descriptions of preferred embodiments according to the present invention with reference to the attached drawings.

BRIEF DESCRIPTION OF THE DRAWINGS

FIGS. 3A to 3E show the calculation results of reflectivity according to a distributed Bragg reflection structure.

FIGS. 4A to 4E are sectional views illustrating a main process in a method for producing a quantum cascade laser according to a second embodiment.

FIGS. 5A to 5E are sectional views illustrating a main process in the method for producing a quantum cascade laser according to the second embodiment.

FIGS. 6A to 6E are sectional views illustrating a main process in the method for producing a quantum cascade laser according to the second embodiment.

FIGS. 9A to 9E are sectional views illustrating a main process in the method for producing a quantum cascade laser according to the second embodiment.

FIGS. 10A to 10E are sectional views illustrating a main process in the method for producing a quantum cascade laser according to the second embodiment.

FIGS. 11A to 11E are sectional views illustrating a main process in the method for producing a quantum cascade laser according to the second embodiment.

FIGS. 12A to 12E are sectional views illustrating a main process in the method for producing a quantum cascade laser according to the second embodiment.

FIGS. 13A and 13B schematically illustrate quantum cascade lasers according to a third embodiment.

FIGS. 15A and 15B schematically illustrate quantum cascade lasers according to a fifth embodiment.

DESCRIPTION OF THE PREFERRED EMBODIMENTS

Figure 1:
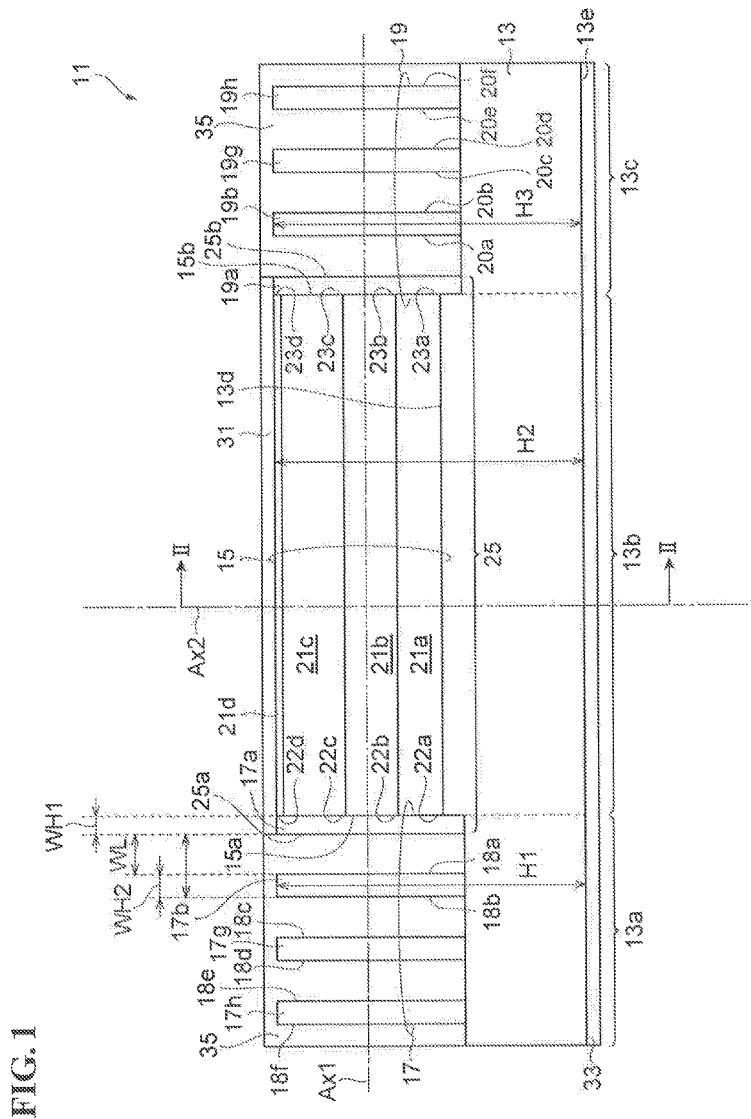
FIG. 1 schematically illustrates a quantum cascade laser according to a first embodiment.

Some embodiments will be described below.

A quantum cascade laser according to an embodiment includes (a) a substrate having a principal surface, the substrate including a first region and a second region arranged along a first axis; (b) a stacked semiconductor layer disposed on the principal surface in the second region of the substrate, the stacked semiconductor layer having an end facet located on a boundary between the first region and the second region of the substrate, the stacked semiconductor layer including a core layer and a cladding layer disposed on the core layer, the core layer and the cladding layer being exposed at the end facet of the stacked semiconductor layer; and (c) a distributed Bragg reflection structure disposed on the principal surface in the first region of the substrate, the distributed Bragg reflection structure including a semiconductor wall and a covering semiconductor wall that covers the end facet of the stacked semiconductor layer, the distributed Bragg reflection structure being optically coupled to the end facet of the stacked semiconductor layer. The semiconductor wall and the covering semiconductor wall are made of a single semiconductor material. The semiconductor wall has a first side surface and a second side surface opposite to the first side surface. The first side surface and the second side surface intersect the first axis and extend along a second axis intersecting the principal surface. The covering semiconductor wall has an end facet that intersects the first axis and extends along the second axis. In addition, the end facet of the covering semiconductor wall is located away from the first side surface and the second side surface of the semiconductor wall.

In the quantum cascade laser according to an embodiment, preferably, the stacked semiconductor layer and the covering semiconductor wall of the distributed Bragg reflection structure constitute a laser structure disposed on the first region and the second region of the substrate. In addition, the end facet of the covering semiconductor wall corresponds to an end facet of the laser structure.

According to this quantum cascade laser, the semiconductor wall and the covering semiconductor wall form a high-refractive-index portion in the distributed Bragg reflection structure. In other words, the covering semiconductor wall and the semiconductor wall constitute part of the distributed Bragg reflection structure. A region between the covering semiconductor wall and the semiconductor wall forms a low-refractive-index portion having a refractive index lower than that of the high-refractive-index portion (semiconductor wall) in the distributed Bragg reflection structure. The distributed Bragg reflection structure is optically coupled to the end facet of the stacked semiconductor layer. The covering semiconductor wall and the semiconductor wall of the distributed Bragg reflection structure are made of a single semiconductor material. Therefore, when the stacked semiconductor layer is etched for forming the distributed Bragg reflection structure, the end facet of the laser structure and the first side surface and the second side surface of the semiconductor wall have good planarity and verticality.

In the quantum cascade laser according to an embodiment, preferably, the end facet of the covering semiconductor wall and the first and second side surfaces of the semiconductor wall are arranged along the first axis. The distributed Bragg reflection structure has a low-refractive-index portion disposed between the end facet of the covering semiconductor wall and the first side surface and a high-refractive-index portion disposed between the first side surface and the second side surface. The low-refractive-index portion has a thickness along the first axis that is an odd multiple of $\lambda/(4\times n1)$, and the high-refractive-index portion has a thickness along the first axis that is an odd multiple of $\lambda/(4\times n2)$, where "$\lambda$," represents a lasing wavelength in vacuum, "n1" represents an effective refractive index of the low-refractive-index portion at the lasing wavelength, and "n2" represents an effective refractive index of the high-refractive-index portion at the lasing wavelength.

According to this quantum cascade laser, the reflectivity of the distributed Bragg reflection structure is increased by forming a distributed Bragg reflection structure including the low-refractive-index portion and the high-refractive-index portion that have the above-described thicknesses, respectively.

In the quantum cascade laser according to an embodiment, preferably, the distributed Bragg reflection structure includes one or more additional semiconductor walls. The distributed Bragg reflection structure further includes a first connecting portion that connects the semiconductor wall and the additional semiconductor walls or that connects the additional semiconductor walls with each other. In addition, the first connecting portion extends along the first axis.

According to this quantum cascade laser, the first connecting portion connects the semiconductor wall and the additional semiconductor wall so that the first connecting portion, the semiconductor wall, and the additional semiconductor walls are regarded as an integrated structure. By forming the first connecting portion, the mechanical strength of the distributed Bragg reflection structure increases. As a result, the production yield of the quantum cascade laser is improved.

In the quantum cascade laser according to an embodiment, preferably, the first connecting portion and the additional semiconductor walls are made of the same semiconductor material as the semiconductor wall.

According to this quantum cascade laser, the first connecting portion and the additional semiconductor walls are made of the same semiconductor material as the semiconductor wall. Therefore, the strength of the distributed Bragg reflection structure is improved. Furthermore, the first connecting portion, the additional semiconductor walls, and the semiconductor wall are formed at a time using the same material, and thus the production process for the distributed Bragg reflection structure may be simplified.

The quantum cascade laser according to an embodiment may further include a second connecting portion that connects the semiconductor wall and the covering semiconductor wall. The second connecting portion extends along the first axis.

According to this quantum cascade laser, the second connecting portion connects the semiconductor wall and the covering semiconductor wall so that the second connecting portion, the semiconductor wall, and the covering semiconductor wall are regarded as an integrated structure. The second connecting portion increases the mechanical strength of the distributed Bragg reflection structure. As a result, the production yield of the quantum cascade laser is improved.

In the quantum cascade laser according to an embodiment, the second connecting portion may be made of the same semiconductor material as the semiconductor wall.

According to this quantum cascade laser, the second connecting portion and the semiconductor wall are made of the same semiconductor material. Therefore, the strength of the distributed Bragg reflection structure is improved. Furthermore, the second connecting portion and the semiconductor wall are formed at a time using the same material. As a result, the production process for the distributed Bragg reflection structure may be simplified.

In the quantum cascade laser according to an embodiment, preferably, the semiconductor wall and the covering semiconductor wall are made of the same semiconductor material as the second connecting portion.

According to this quantum cascade laser, all of the second connecting portion, the semiconductor wall, and the covering semiconductor wall are made of the same semiconductor material. Therefore, the strength of the distributed Bragg reflection structure is improved. Furthermore, the second connecting portion, the semiconductor wall, and the covering semiconductor wall are formed at a time using the same material. Therefore, the production process for the distributed Bragg reflection structure may be simplified.

In the quantum cascade laser according to an embodiment, preferably, the semiconductor material constituting the semiconductor wall and the covering semiconductor wall is an undoped semiconductor or a semi-insulating semiconductor.

According to this quantum cascade laser, an undoped semiconductor and a semi-insulating semiconductor have high resistivity against electrons. Therefore, the covering semiconductor wall made of an undoped semiconductor or a semi-insulating semiconductor does not generate a leakage current. Furthermore, the undoped semiconductor or the semi-insulating semiconductor hardly absorbs light in a mid-infrared region due to free carrier absorption. Thus, the covering semiconductor wall and the semiconductor wall made of an undoped semiconductor or a semi-insulating semiconductor do not pose a problem of light absorption due to free carriers. As a result, the effective reflectivity of the distributed Bragg reflection structure is improved.

In the quantum cascade laser according to an embodiment, preferably, the semiconductor wall has a top surface that is located higher than a top surface of the stacked semiconductor layer. According to this quantum cascade laser, the top surface of the semiconductor wall is located higher than the top surface of the stacked semiconductor layer. Therefore, a larger amount of light diverged from the first end facet is reflected by the semiconductor wall. Therefore, the distributed Bragg reflection structure having high reflectivity is easily obtained.

In the quantum cascade laser according to an embodiment, preferably, the semiconductor wall has a top surface that is located lower than a top surface of the stacked semiconductor layer. According to this quantum cascade laser, when die bonding is performed in an epi-down configuration, physical damage to the semiconductor wall during mounting the quantum cascade laser chip on a submount is avoided.

In the quantum cascade laser according to an embodiment, preferably, the semiconductor wall has a wall width along a third axis that intersects the first axis and the second axis. The substrate has a substrate width along the third axis. The wall width is smaller than the substrate width. According to this quantum cascade laser, the in-plane uniformity and reproducibility in the etching in the step of forming the semiconductor wall is improved.

In the quantum cascade laser according to an embodiment, preferably, the distributed Bragg reflection structure further includes one or more additional semiconductor walls and an embedded region that is disposed between the semiconductor wall and the covering semiconductor wall, between the semiconductor wall and the additional semiconductor wall, or between the additional semiconductor walls. The embedded region contains at least one of silicon dioxide, silicon oxy-nitride, silicon nitride, alumina, BCB resin, and polyimide resin. According to this quantum cascade laser, the embedded region of the distributed Bragg reflection structure is made of the material having a refractive index lower than that of a semiconductor. When the embedded region is formed using the above material, the mechanical strength of the distributed Bragg reflection structure is improved.

In the quantum cascade laser according to an embodiment, preferably, the distributed Bragg reflection structure further includes one or more additional semiconductor walls and a gap that is disposed between the semiconductor wall and the covering semiconductor wall, between the semiconductor wall and the additional semiconductor wall, or between the additional semiconductor walls. According to this quantum cascade laser, a gap formed of an air layer or the like constitutes the low-refractive-index portion.

The findings of the present invention can be easily understood from detailed descriptions below with reference to the attached drawings illustrating examples. Hereinafter, embodiments relating to a quantum cascade laser and a method for producing a quantum cascade laser according to embodiments of the present invention will be described with reference to the attached drawings. When possible, the same components are denoted by the same reference numerals.

First Embodiment

FIG. 1 schematically illustrates a quantum cascade laser (QCL) according to this embodiment. FIG. 1 illustrates a quantum cascade laser 11 including a distributed Bragg reflection structure. FIG. 1 is a sectional view taken in a direction in which an optical waveguide of the quantum cascade laser 11 extends. The quantum cascade laser 11 includes a substrate 13, a stacked semiconductor layer 15, a distributed Bragg reflection structure 17, and another distributed Bragg reflection structure 19. The substrate 13 includes a first region 13a, a second region 13b, and a third region 13c. The first region 13a, the second region 13b, and the third region 13c are arranged along a first axis Ax1 that indicates a direction in which the optical waveguide of the quantum cascade laser 11 extends. The substrate 13 has a principal surface 13d and a back surface 13e. Thus, each of the first region 13a, the second region 13b, and the third region 13c also has the principal surface 13d and the back surface 13e.

The stacked semiconductor layer 15 is disposed on the principal surface 13d in the second region 13b of the substrate 13. The stacked semiconductor layer 15 has an end facet 15a (first end facet) and another end facet 15b (second end facet). These end facets 15a and 15b intersect the first axis Ax1. In the stacked semiconductor layer 15, the end facet 15a is located at a boundary between the first region 13a and the second region 13b. The other end facet 15b is located at a boundary between the second region 13b and the third region 13c. The stacked semiconductor layer 15 includes a lower cladding layer 21a, a core layer 21b, an upper cladding layer 21c, and a contact layer 21d. The lower cladding layer 21a, the core layer 21b, and the upper cladding layer 21c constitute an optical waveguide of the quantum cascade laser 11. The lower cladding layer 21a, the core layer 21b, the upper cladding layer 21c, and the contact layer 21d are arranged along a second axis Ax2 that intersects the principal surface 13d. In this embodiment, the second axis Ax2 corresponds to a normal axis of the principal surface 13d. The lower cladding layer 21a, the core layer 21b, the upper cladding layer 21c, and the contact layer 21d extend from the other end facet 15b to the end facet 15a. Therefore, the end facet 15a of the stacked semiconductor layer 15 includes an end facet 22a of the lower cladding layer 21a, an end facet 22b of the core layer 21b, an end facet 22c of the upper cladding layer 21c, and an end facet 22d of the contact layer 21d. The other end facet 15b of the stacked semiconductor layer 15 includes an end facet 23a of the lower cladding layer 21a, an end facet 23b of the core layer 21b, an end facet 23c of the upper cladding layer 21c, and an end facet 23d of the contact layer 21d.

Example of Stacked Semiconductor Layer 15

Lower cladding layer 21a: Si-doped n-type InP
Core layer 21b: quantum well structure in which well layers made of GaInAs and barrier layers made of AlInAs are alternately stacked
Upper cladding layer 21c: Si-doped n-type InP
Contact layer 21d: Si-doped n-type GaInAs
Substrate 13: n-type InP The substrate 13 is an n-InP substrate, for example. The semiconductor layers included in the stacked semiconductor layer 15 are constituted of materials substantially lattice-matched to the InP substrate. Therefore, the semiconductor layers are epitaxially grown on the InP substrate so as to have good crystal quality. In addition, the substrate needs to have electrical conductivity for the purpose of injecting electric current into the QCL. In the QCL, since electrons are used as carriers as described later, an n-InP substrate is preferably used in terms of conductivity type. InP is transparent to the light of a mid-infrared wavelength range and hardly absorbs light of this mid-infrared wavelength range. Therefore, InP is used for an upper cladding layer disposed on the core layer and a lower cladding layer disposed below the core layer. Herein, the lower cladding layer is not necessarily disposed. The lower cladding layer may be omitted as long as the substrate is made of a material (e.g., InP) transparent to light emitted from the QCL and the substrate also serves as the lower cladding layer. InP is a binary crystal, and thus crystal growth and a treatment using etching are easily performed. InP also has a relatively large thermal conductivity. Therefore, good heat dissipation is imparted to the quantum cascade laser by using InP for the cladding layer of the quantum cascade laser.

In the core layer, several tens of unit structures each constituted by an active layer and an injection layer are periodically stacked so as to form a structure in which the active layers and the injection layers are alternately connected to each other in a multilayered manner. The core layer has a thickness of several micrometers (e.g., 1 to 3 μm). Each of the active layers and the injection layers includes well layers with a thickness of several nanometers and barrier layers with a thickness of several nanometers. The barrier layer has a bandgap energy higher than that of the well layer. Several hundred well layers and barrier layers are alternately stacked to constitute a super-lattice structure.

When a particular electric filed is generated in the core layer by applying voltage to the core layer, an electron transfer path constituted by subband levels in the core layer is formed in the core layer. In this electron transfer path, electrons serving as carriers are injected into an upper level of the active layer on the high-potential side by the electric filed. Subsequently, the electrons injected into the upper level undergo transition to a lower level. As a result of this transition, light with a wavelength corresponding to the difference in energy between the two levels is generated. After the transition, the electrons relax from the lower level to a relaxation level due to the release of longitudinal optical (LO) phonons, followed by electron transfer to the adjacent unit structure through the injection layer. Such electron transition for light emission and electron transfer repeatedly occur in each of unit structures connected in a multilayered manner. The difference in energy between the upper level and the lower level is controlled in accordance with the material compositions and thicknesses of the well layer and the barrier layer that constitute the active layer, and thus light having a wavelength of about 3 to 20 μm in an infrared region is generated. To achieve infrared light emission, for example, the well layer is made of GaInAs and the barrier layer is made of AlInAs.

A contact layer 21d is disposed in order to achieve good ohmic contact with an upper electrode. The contact layer is made of, for example, GaInAs, that has a low bandgap energy and is lattice-matched to an InP substrate. When good ohmic contact with an upper electrode is achieved without the contact layer, the contact layer may be omitted. Furthermore, an optical confinement layer for strengthening the confinement of guided light in the core layer may be optionally disposed on and below (on or below) the core layer. The optical confinement layer is made of a material, such as undoped GaInAs or n-type GaInAs, that has a refractive index higher than that of the cladding layer (lower cladding layer or upper cladding layer) and that is lattice-matched to an InP substrate.

The distributed Bragg reflection structure 17 (first distributed Bragg reflection structure) is disposed on the principal surface 13d in the first region 13a of the substrate 13. The other distributed Bragg reflection structure 19 (second distributed Bragg reflection structure) is disposed on the principal surface 13d in the third region 13c of the substrate 13. The end facet 15a of the stacked semiconductor layer 15 is optically coupled to the distributed Bragg reflection structure 17. The other end facet 15b of the stacked semiconductor layer 15 is optically coupled to the other distributed Bragg reflection structure 19. In this embodiment, the distributed Bragg reflection structure 19 may have reflection characteristics different from those of the distributed Bragg reflection structure 17. However, the distributed Bragg reflection structure 19 has substantially the same structure as the distributed Bragg reflection structure 17, except for the difference in optical characteristics. Subsequently, the distributed Bragg reflection structure 17 will be described. The quantum cascade laser 11 in FIG. 1 includes a Fabry-Perot type cavity having two end facets that are constituted by distributed Bragg reflection structures. When necessary, for example, the quantum cascade laser may include a Fabry-Perot type cavity in which one of the end facets is a cleaved facet and the other of the end facets is constituted by a distributed Bragg reflection structure.

The distributed Bragg reflection structure 17 (distributed Bragg reflection structure 19) includes a covering semiconductor wall 17a (covering semiconductor wall 19a) and a semiconductor wall 17b (semiconductor wall 19b). The semiconductor wall 17b (semiconductor wall 19b) extends along the second axis Ax2 and the covering semiconductor wall 17a (19a) is in contact with the end facet 15a (15b).

Example of the Distributed Bragg Reflection Structure 17 (19)

Semiconductor Wall 17b (19b): semi-insulating InP or undoped InP
Covering semiconductor wall 17a (19a): semi-insulating InP or undoped InP The stacked semiconductor layer 15 and the covering semiconductor wall 17a (19a) of the distributed Bragg reflection structure 17 (19) constitute a laser structure 25. The laser structure 25 is disposed in the first region 13a, the second region 13b, and the third region 13c of the substrate 13. The laser structure 25 has a first end facet 25a and a second end facet 25b. The first end facet 25a and the second end facet 25b each intersect the first axis Ax1 and extend along the second axis Ax2. The covering semiconductor wall 17a (19a) provides the first end facet 25a (second end facet 25b).

The semiconductor wall 17b (semiconductor wall 19b) has a first side surface 18a (20a) and a second side surface 18b (20b). The first side surface 18a (20a) and the second side surface 18b (20b) each intersect the first axis Ax1 and extend along the second axis Ax2. The first end facet 25a (second end facet 25b) of the laser structure 25 is located away from the first side surface 18a (20a) and the second side surface 18b (20b) of the semiconductor wall 17b (semiconductor wall 19b). The semiconductor wall 17b (19b) and the covering semiconductor wall 17a (19a) are made of a single semiconductor material. Therefore, the first end facet 25a, the first side surface 18a, and the second side surface 18b of the semiconductor wall 17b are also made of a single semiconductor material. Similarly, the second end facet 25b, the first side surface 20a, and the second side surface 20b of the semiconductor wall 19b are also made of a single semiconductor material.

In this quantum cascade laser 11, the distributed Bragg reflection structure 17 (19) is optically coupled to the end facet 15a (15b) of the stacked semiconductor layer 15. The covering semiconductor wall 17a (19a) of the laser structure 25 and the semiconductor wall 17b (19b) constitute a distributed Bragg reflection structure. The covering semiconductor wall 17a (19a) of the laser structure 25 and the semiconductor wall 17b (19b) are made of a single semiconductor material. Thus, when the laser structure 25 and the distributed Bragg reflection structure 17 (19) are formed by etching, the first end facet 25a (second end facet 25b) of the laser structure 25 and the first side surface 18a (20a) and second side surface 18b (20b) of the semiconductor wall 17b (19b) having good planarity and verticality are obtained.

The single semiconductor material for the covering semiconductor wall 17a (19a) and the semiconductor wall 17b (19b) may be an undoped semiconductor such as undoped InP or a semi-insulating semiconductor such as Fe-doped InP. In this quantum cascade laser 11, the undoped semiconductor has high resistivity against electrons. Furthermore, the semi-insulating semiconductor has sufficiently high resistivity against electrons. Therefore, the covering semiconductor wall made of such an undoped semiconductor or a semi-insulating semiconductor is effective to suppress a leakage current passing through the covering semiconductor wall. Furthermore, the undoped semiconductor and the semi-insulating semiconductor cause only a small amount of light absorption due to free carriers (free electrons) in a mid-infrared region. Thus, the covering semiconductor wall and semiconductor wall made of an undoped semiconductor or a semi-insulating semiconductor hardly absorb light in a mid-infrared region. Specifically, the end facet formed by integrating the distributed Bragg reflection structure maintains high reflectivity because of low light absorption in the covering semiconductor wall and the semiconductor wall.

Figure 2:
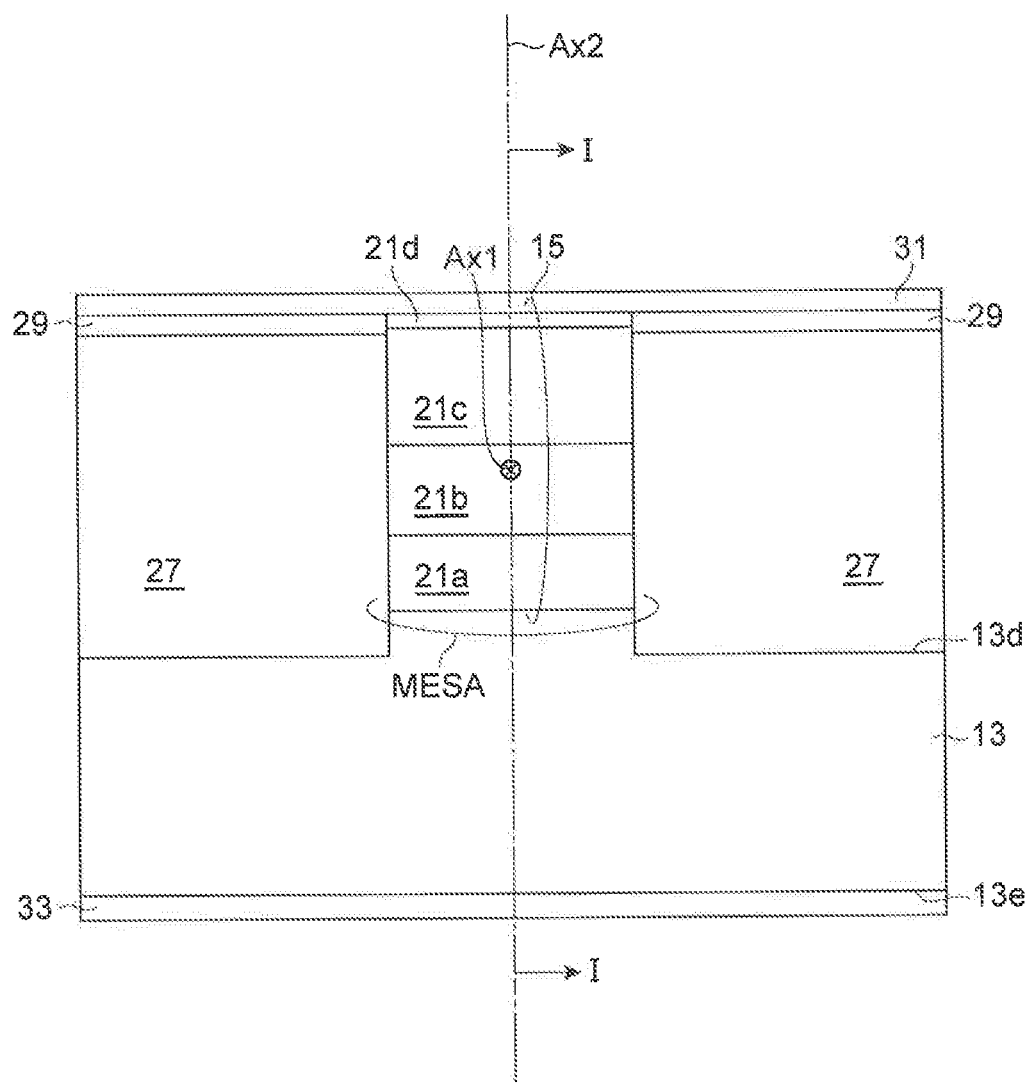
FIG. 2 is a sectional view of the quantum cascade laser taken along line II-II of FIG. 1.

FIG. 2 is a sectional view of the quantum cascade laser taken along line II-II of FIG. 1. FIG. 1 is a sectional view of the quantum cascade laser taken along line I-I of FIG. 2. The laser structure 25 includes a current blocking layer 27 for confining electric current. The current blocking layer 27 is formed on side surfaces of a stripe-shaped stacked semiconductor layer 15 (semiconductor mesa waveguide MESA) and on the principal surface 13d of the substrate 13. The upper surface of the current blocking layer 27 is covered with an insulating layer 29. The insulating layer 29 is, for example, a silicon-based inorganic insulating layer made of silicon nitride (SiN) or silicon dioxide ($SiO_2$), for example. An upper electrode 31 is disposed on the stacked semiconductor layer 15 and the insulating layer 29. The upper electrode 31 is in contact with the contact layer 21d in the stacked semiconductor layer 15 through an opening of the insulating layer 29. A backside electrode 33 is disposed on the back surface 13e of the substrate 13. The backside electrode 33 is in contact with the back surface 13e of the substrate 13.

Example of Current Blocking Structure

Current blocking layer 27: semi-insulating InP or undoped InP
Insulating layer 29: silicon nitride (SiN) or silicon dioxide ($SiO_2$)
Upper electrode 31: Ti/Au or Ge/Au
Backside electrode 33: Ti/Au or Ge/Au In the distributed Bragg reflection structure 17 of the quantum cascade laser 11, the first end facet 25a, the first side surface 18a, and the second side surface 18b are arranged in that order along the first axis Ax1. Hereafter, the distributed Bragg reflection structure 17 will be described. The distributed Bragg reflection structure 19 has the same configuration as the distributed Bragg reflection structure 17. A region between the semiconductor wall 17b and the covering semiconductor wall 17a along the first axis Ax1 functions as a low-refractive-index portion of the distributed Bragg reflection structure 17. The semiconductor wall 17b functions as a high-refractive-index portion of the distributed Bragg reflection structure 17. The distance between the semiconductor wall 17b and the covering semiconductor wall 17a along the first axis Ax1 (e.g., the distance between the first end facet 25a and the first side surface 18a) is an odd multiple of $\lambda/(4 \times n1)$. The thickness of the semiconductor wall 17b along the first axis Ax1 (e.g., the distance between the first side surface 18a and the second side surface 18b) is an odd multiple of $\lambda/(4 \times n2)$. Herein, "$\lambda$" represents a lasing wavelength in vacuum of the quantum cascade laser 11, "n1" represents an effective refractive index of the low-refractive-index portion at the lasing wavelength $\lambda$, and "n2" represents an effective refractive index of the high-refractive-index portion at the lasing wavelength $\lambda$. In this quantum cascade laser 11, when the distributed Bragg reflection structure 17 (19) has the above-described distances, the reflectivity of the distributed Bragg reflection structure 17 (19) is maximized.

In the quantum cascade laser 11, the distributed Bragg reflection structure 17 (19) may further include an embedded region 35. The embedded region 35 is disposed in the low-refractive-index portion between the covering semiconductor wall 17a (19a) and the semiconductor wall 17b (19b). The embedded region 35 may contain at least one of silicon dioxide ($SiO_2$), silicon oxy-nitride (SiON), silicon nitride (SiN), alumina ($Al_2O_3$), benzocyclobutene (BCB) resin, and polyimide resin. In this quantum cascade laser 11, the material for the embedded region 35 of the distributed Bragg reflection structure has a refractive index lower than that of the semiconductor used for the covering semiconductor wall 17a (19a) and the semiconductor wall 17b (19b).

Alternatively, an air gap may be formed in the low-refractive-index portion between the covering semiconductor wall 17a (19a) and the semiconductor wall 17b (19b). In the distributed Bragg reflection structure 17 (19) of the quantum cascade laser 11, the air gap has a refractive index lower than that of the semiconductor used for the covering semiconductor wall 17a (19a) and the semiconductor wall 17b (19b).

The distributed Bragg reflection structure 17 (19) may include one or more additional semiconductor walls that constitute a high-refractive-index portion in the distributed Bragg reflection structure 17 (19) and that are made of a single semiconductor material. FIG. 1 illustrates, for example, a structure in which two additional semiconductor walls 17g (19g) and 17h (19h) are added to the distributed Bragg reflection structure 17 (19). The additional semiconductor wall 17g (19g) has a third side surface 18c (20c) and a fourth side surface 18d (20d). The additional semiconductor wall 17h (19h) has a fifth side surface 18e (20e) and a sixth side surface 18f (20f). In the distributed Bragg reflection structure 17 (19) having the additional semiconductor walls, regions between two adjacent semiconductor walls, that is, a region between the semiconductor wall 17b (19b) and the additional semiconductor wall 17g (19g) and a region between the additional semiconductor wall 17g (19g) and the additional semiconductor wall 17h (19h) constitute low-refractive-index portions in the distributed Bragg reflection structure 17 (19). The number of the additional semiconductor walls in the distributed Bragg reflection structure 17 (19) is related to the reflectivity of the distributed Bragg reflection structure. As the number of the additional semiconductor walls increases, the reflectivity of the distributed Bragg reflection structure increases. The thickness of the semiconductor wall 17b (19b) and the additional semiconductor walls 17g (19g) and 17h (19h) each serving as a high-refractive-index portion in a direction of the first axis Ax1 is adjusted to a thickness that achieves high reflection with respect to the lasing wavelength λ, such as a thickness of the odd multiple of $\lambda/(4 \times n2)$. The distance of a region between the semiconductor wall 17b (19b) and the covering semiconductor wall 17a (19a) and regions of two adjacent semiconductor walls, that is, a region between the semiconductor wall 17b (19b) and the additional semiconductor wall 17g (19g) and a region between the additional semiconductor wall 17g (19g) and the additional semiconductor wall 17h (19h) each serving as a low-refractive-index portion in a direction of the first axis Ax1 is adjusted to be a distance that achieves high reflection with respect to the lasing wavelength λ, such as a distance of the odd multiple of $\lambda/(4 \times n1)$. Furthermore, the low-refractive-index portion between the two adjacent semiconductor walls may be the embedded region 35 or an air gap as in the case of the low-refractive-index portion between the covering semiconductor wall 17a (19a) and the semiconductor wall 17b (19b). The covering semiconductor wall 17a (19a), the semiconductor wall 17b (19b), and the additional semiconductor walls 17g (19g) and 17h (19h) are made of a single semiconductor material. When the covering semiconductor wall 17a (19a), the semiconductor wall 17b (19b), and the additional semiconductor walls 17g (19g) and 17h (19h) are formed by etching, side surfaces with good planarity and verticality are formed. The first end facet 25a, the second side surface 18b, the fourth side surface 18d, and the sixth side surface 18f are periodically arranged. The first side surface 18a, the third side surface 18c, and the fifth side surface 18e are periodically arranged. The additional semiconductor walls 17g (19g) and 17h (19h) are formed substantially in the same manner as that of the semiconductor wall 17b (19b). Therefore, to facilitate the understanding, the additional semiconductor walls 17g (19g) and 17h (19h) are collectively referred to as the semiconductor walls 17b (19b) in the following description.

As described above, in the direction of the first axis Ax1, a laser main body including the laser structure 25 is disposed in a central portion of the quantum cascade laser 11, and the distributed Bragg reflection structure 17 (19) is disposed near each of end portions of the quantum cascade laser 11. The height H1 of the semiconductor wall 17b, the height H2 of the stacked semiconductor layer 15 from the bottom to the uppermost surface (n-type contact layer), and the height H3 of the semiconductor wall 19b are substantially the same height. These heights H1, H2, and H3 are measured from the back surface 13e of the substrate to the uppermost surface of each of the semiconductor wall 17b, the stacked semiconductor layer 15 and the semiconductor wall 19b.

A preferred embodiment will be described. The semi-insulating semiconductor is made of, for example, InP, GaInAs, AlInAs, GaInAsP, and AlGaInAs doped with a transition metal of Fe, Ti, Cr, or Co. These transition metals form a deep level that traps electrons in the forbidden band of the semiconductor material. Therefore, the semiconductor material doped with these transition metals has a high resistivity so as to become a semi-insulating III-V compound semiconductor. A suitable transition metal is, for example, Fe. The semi-insulating III-V compound semiconductor doped with the transition metal (for example, Fe) has a resistivity of $10^5$ Ωcm or more against electrons. Therefore, the semi-insulating semiconductor containing a transition metal is used for a current blocking layer. Furthermore, an undoped semiconductor also has a relatively high resistivity, and thus is used for a current blocking layer. For example, InP, GaInAs, AlInAs, GaInAsP, and AlGaInAs are used for the undoped semiconductor. In the undoped semiconductor and semi-insulating semiconductor, the concentration of free carriers (here, electrons) is low, and thus mid-infrared light is hardly absorbed in these undoped semiconductor and semi-insulating semiconductor. Furthermore, the semiconductor materials such as InP, GaInAs, AlInAs, GaInAsP, and AlGaInAs have a relatively large bandgap and are transparent to mid-infrared light. Therefore, light absorption caused by subband transition, which is a main light absorption mechanism of mid-infrared light other than the free carrier absorption, also does not occur. Accordingly, when a semiconductor such as the undoped or semi-insulated InP, GaInAs, AlInAs, GaInAsP, AlGaInAs, or the like is used for a current blocking layer, the light absorption caused by free carriers and subband transition in the current blocking layer is effectively suppressed. As a result, good lasing characteristics are maintained. Furthermore, the undoped semiconductor and the semi-insulating semiconductor have high thermal conductivity. When the undoped semiconductor or the semi-insulating semiconductor is used for a current blocking layer, the heat dissipation in the quantum cascade laser (QCL) is improved, which allows a high-temperature operation. In particular, an InP semiconductor has the high thermal conductivity among semiconductor materials that are used for a mid-infrared quantum cascade laser. By employing the InP semiconductor as the current blocking layer, high heat dissipation is achieved for the quantum cascade laser (QCL). Herein, other semiconductors such as AlInAs and AlGaInAs may be used in addition to or instead of the InP semiconductor. AlInAs and AlGaInAs have a bandgap larger than that of InP. When they are applied to a current blocking layer, the energy discontinuity (energy discontinuity at a conduction band edge) at an interface between the mesa waveguide and the current blocking layer is increased compared with the current blocking layer made of InP. This provides a large energy barrier (energy barrier against electrons) at the interface between the mesa waveguide and the current blocking layer. In this form, the leakage of electrons from the mesa waveguide to the current blocking layer is further reduced due to not only high resistivity in the current blocking layer but also the increase in energy barrier.

The insulating layer 29 on the current blocking layer 27 is made of a dielectric material such as $SiO_2$, SiON, SiN, and alumina, or a resin such as BCB resin and polyimide resin. These materials exhibit excellent durability and insulating properties for a protective film in a semiconductor device and are easily formed into a film. The insulating layer is not necessarily disposed, and may be omitted when sufficient current confinement in the mesa waveguide is achieved by using only the current blocking layer 27.

The covering semiconductor wall 17a (19a), the semiconductor wall 17b (19b), and the additional semiconductor walls 17g (19g) and 17h (19h) in the distributed Bragg reflection structure 17 (19) serve as high-refractive-index portions in the distributed Bragg reflection structure. The regions between these walls serve as low-refractive-index portions in the distributed Bragg reflection structure. Each of the low-refractive-index portions has a refractive index lower than that of a semiconductor in each of the high-refractive-index portions. Specifically, the low-refractive-index portion may be an air gap to include gas such as air between the walls. Alternatively, the low-refractive-index portion may be an embedded region filled with a substance having a refractive index lower than that of a semiconductor in the high-refractive-index portion. For example, the embedded region is made of a dielectric material such as silicon dioxide ($SiO_2$), silicon oxy-nitride (SiON), silicon nitride (SiN), and alumina ($Al_2O_3$), or a resin such as BCB resin and polyimide resin. The low-refractive-index portion may be constituted by a combination of the air gap and the embedded region. When the low-refractive-index portion is an air gap, the difference in refractive index between the high-refractive-index portion and the low-refractive-index portion is maximized, which easily achieves high reflectivity at the end facet of a cavity formed by integrating the distributed Bragg reflection structure. When an embedded region filled with a dielectric material or the like is used for the low-refractive-index portion, the material for the embedded region protects the surfaces of the semiconductor wall made of a single semiconductor material and prevents the degradation of the surface due to oxidation described later. Furthermore, when the embedded region is used as the low-refractive-index portion, the semiconductor wall is supported by the material for the embedded region, which improves the mechanical strength of the distributed Bragg reflection structure 17 (19).

Herein, the advantages of the quantum cascade laser according to this embodiment over conventional quantum cascade lasers will be described. A conventional quantum cascade laser has the following structure.

(1) A conventional quantum cascade laser does not include the covering semiconductor wall 17a (19a) of the quantum cascade laser according to the embodiment. The laser main body of the conventional quantum cascade laser is constituted by only the stacked semiconductor layer. Therefore, the end facet of the stacked semiconductor layer is exposed in end portions of the laser main body.

(2) The semiconductor walls of the distributed Bragg reflection structure are formed of the same plurality of semiconductor layers as those such as a core layer and a cladding layer that constitute the stacked semiconductor layer.

Except for the above structure, the conventional quantum cascade laser has the same structure as that shown in FIG.

1. In the conventional quantum cascade laser, the laser main body and the semiconductor walls are simultaneously formed by etching a plurality of semiconductor layers until reaching the substrate, the semiconductor layers extending along the first axis Ax1 and being made of different materials. Therefore, in the conventional quantum cascade laser, the end facets of the plurality of semiconductor layers including a core layer and a cladding layer are exposed at the end facet (end facet formed by etching) of the laser main body and at the side surfaces (side surfaces formed by etching) of the semiconductor walls in the high-refractive-index portion of the distributed Bragg reflection structure. However, if these semiconductor layers are etched under the same etching conditions, the etching is not uniformly performed because the semiconductor layers have different etching rates and etching directions. As a result of nonuniform etching such as side etching at interfaces between different semiconductor layers and anisotropic etching, irregularities and steps are easily formed at the end facet of the laser main body and at the side surfaces of the semiconductor walls in the high-refractive-index portion. In particular, in the embodiment, the quantum cascade laser emits light having a long wavelength of about 3 to 20 µm. Light propagating in the core layer is widely distributed to the cladding layer and the substrate which are located outside the core layer. Therefore, to achieve high reflectivity in the distributed Bragg reflection structure, the etching depth of the semiconductor layers in a direction of the second axis Ax2 needs to be as large as about 5 to 10 µm so that the etching reaches the middle of the substrate. Thus, irregularities are easily formed more considerably at the end facet of the laser main body region and the side surfaces of the semiconductor walls in the high-refractive-index portion as a result of the nonuniform etching. Such irregularities impair the verticality at the end facet of the laser main body and at the side surfaces of the semiconductor walls in the distributed Bragg reflection structure. This decreases the effective reflectivity of the distributed Bragg reflection structure. For example, if the side surfaces of the semiconductor walls and the end facet of the laser main body are inclined about 5 degrees with respect to the reference plane vertical to the waveguide axis (first axis Ax1), the effective reflectivity of the distributed Bragg reflection structure significantly decreases from 85% (theoretical value) to 30% (measured value). This makes it difficult to achieve high reflectivity using the distributed Bragg reflection structure in the conventional quantum cascade laser. To prevent the degradation of verticality, appropriate etching conditions need to be selected on the semiconductor layers such as a core layer and a cladding layer that are included in the laser main body and the semiconductor walls in the distributed Bragg reflection structure. However, setting different etching conditions for the semiconductor layers requires much effort. Even if an appropriate etching condition is found for each of the semiconductor layers, whether the verticality of the end facet is achieved with certainty is unclear. Even if the verticality is achieved with certainty, it is difficult to achieve practical use because the etching process is complicated and the productivity is decreased.

In the conventional quantum cascade laser, as described above, the semiconductor walls in the distributed Bragg reflection structure are constituted by the semiconductor layers having the same configuration as that of the laser main body. Therefore, the semiconductor walls are formed of layers that absorb light emitted from the core layer in the laser main body. For example, the semiconductor walls include the highly doped contact layer and cladding layer having large free carrier absorption and the core layer having large light absorption due to subband transition of the conduction band. Due to the absorption of light in the semiconductor walls, the effective reflectivity at the end facet formed by integrating the distributed Bragg reflection structure is decreased.

In the production of the distributed Bragg reflection structure 17 (19) of the quantum cascade laser according to this embodiment, the covering semiconductor wall 17a (19a), the semiconductor wall 17b (19b), and the additional semiconductor walls 17g (19g) and 17h (19h) are formed by etching, but they are made of a single semiconductor material such as InP. Therefore, irregularities on the etched side surfaces due to nonuniform etching, such as side etching, are not formed in the quantum cascade laser according to this embodiment. Hence, the end facets of the laser structure 25 serving as the laser main body (the side surfaces of the covering semiconductor wall 17a (19a)) and the side surfaces of the semiconductor wall 17b (19b) and the additional semiconductor walls 17g (19g) and 17h (19h) have good planarity and verticality. Consequently, the high effective reflectivity of the distributed Bragg reflection structure is maintained for the quantum cascade laser according to this embodiment. In the embodiment, all of the covering semiconductor wall 17a (19a), the semiconductor wall 17b (19b), and the additional semiconductor walls 17g (19g) and 17h (19h) are made of a single semiconductor. Therefore, etching is performed under an optimum single etching condition.

Furthermore, the light absorption caused by free carriers in a mid-infrared region is reduced by using a semi-insulating or undoped semiconductor such as InP, GaInAs, AlInAs, GaInAsP, or AlGaInAs as the single semiconductor material. These semiconductor materials are transparent to mid-infrared light emitted from the quantum cascade laser 11, and thus the light absorption caused by subband transition is also reduced. Hence, a decrease in the effective reflectivity of the distributed Bragg reflection structure due to the light absorption caused by free carriers and subband transition is avoided by using the semiconductor material for the covering semiconductor wall 17a (19a), the semiconductor wall 17b (19b), and the additional semiconductor walls 17g (19g) and 17h (19h). Consequently, the distributed Bragg reflection structure having high reflectivity is easily achieved.

More specifically, a semiconductor region made of a single semiconductor material is prepared in order to form the distributed Bragg reflection structure 17 (19). When the semiconductor region is etched, the etchant always continues to etch the single semiconductor material. Therefore, in this etching, side etching between different semiconductor layers does not occur and anisotropic etching caused by the material dependence of etching directions also does not occur. Furthermore, this etching is performed under an optimum single etching condition in which the single semiconductor is vertically etched.

In the quantum cascade laser 11, the covering semiconductor wall 17a (19a) is made of a single semiconductor with high resistivity. Therefore, a leakage current is prevented from flowing through the covering semiconductor wall 17a (19a). The single semiconductor material with high resistivity may contain, for example, the above-described semi-insulating or undoped semiconductor such as InP, GaInAs, AlInAs, GaInAsP, or AlGaInAs.

When AlInAs or AlGaInAs having a bandgap larger than that of InP is applied to the distributed Bragg reflection structure 17 (19), the energy discontinuity (potential barrier) of a conduction band edge at the interface between the covering semiconductor wall in the distributed Bragg reflection structure 17 (19) and the mesa waveguide including a core layer and a cladding layer is increased compared with the case where InP is used. This thus can reduce the leakage current through the covering semiconductor wall.

In the case of the conventional quantum cascade laser, a plurality of semiconductor layers such as a core layer and a cladding layer formed by etching is exposed to the air at the end facet of the laser main body as described above. In this case, for example, oxygen and moisture in the air adsorb onto the end facet, and the oxidation of the end facet proceeds over time. In particular, in a mid-infrared quantum cascade laser, AlInAs is used as one of materials for the core layer. The core layer includes a semiconductor layer containing high-concentration Al, and thus the core layer exposed at the end facet is easily oxidized. With the progress of the oxidation, crystal defects tend to be grown on the end facet and impurities such as an oxide are formed on the end facet. These defects and impurities facilitate non-radiative recombination. Therefore, degradations of laser characteristics such as an increase in threshold current and a decrease in optical output occur with the progress of the oxidation of the end facet. In the structure according to this embodiment, the end facets 15a and 15b of the stacked semiconductor layer 15 are protected by the covering semiconductor wall 17a (19a), and the end facets 15a and 15b including end facets of the core layer are not in direct contact with the air. Accordingly, the degradation of laser characteristics due to the oxidation of the end facet is suppressed. In the embodiment, the side surface of the covering semiconductor wall 17a (19a) forms the end facet of the laser main body and contacts the air. In order to suppress the oxidation of the side surface of the covering semiconductor wall caused by the contact with the air, the covering semiconductor wall 17a (19a) is desirably made of a material not containing Al, such as InP, GaInAs, or GaInAsP.

In the above structure of the quantum cascade laser (QCL), electrons are used as carriers, but holes may be used as carriers. In this case, the n-type semiconductor layers and the n-type substrate illustrated in FIG. 1 are changed to p-type semiconductor layers and a p-type substrate.

The specifications of the structure of the distributed Bragg reflection structure 17 (19) have been studied. In order to obtain the distributed Bragg reflection structure having high reflectivity, the distance WL of a region between two adjacent semiconductor walls and a region between the side surface of the semiconductor wall and the end facet of the covering semiconductor wall, and the thickness WH2 of each semiconductor wall serving as the high-refractive-index portion are desirably set to an odd multiple of $\lambda/(4\times n)$ as described above. Here, the region between two adjacent semiconductor walls and the region between the side surface of the semiconductor wall and the end facet of the covering semiconductor wall serve as the low-refractive-index portion in the distributed Bragg reflection structure. In many cases, the distance and the thickness are set to $\lambda/(4\times n)$ or $3\times\lambda/(4\times n)$. Herein, "$\lambda$" represents a lasing wavelength in vacuum and "n" represents an effective refractive index in each region (high-refractive-index region and low-refractive-index region) at the corresponding lasing wavelength. The thickness WH1 of the covering semiconductor wall is, for example, in the range described later.

Next, the effective reflectivity of the distributed Bragg reflection structure will be calculated using, as a calculation model, a distributed Bragg reflection structure that satisfies the following conditions.

(1) A quantum cascade laser of the calculation model includes an Fe—InP buried heterostructure and has a lasing wavelength of 7.54 µm.

(2) The distributed Bragg reflection structure has end facets and side surfaces with ideal verticality and flatness not subjected to side etching or the like. The high-refractive-index portion (covering semiconductor wall, semiconductor wall, and additional semiconductor walls) of the distributed Bragg reflection structure is made of an Fe—InP semi-insulating semiconductor. The low-refractive-index portion is constituted by an air gap filled with air. Based on this structure, there is assumed to be no light absorption caused by the distributed Bragg reflection structure.

(3) The thickness WH2 of each semiconductor wall serving as the high-refractive-index portion and the distance WL of the low-refractive-index portion constituted by air are set to the above-described odd multiple of $\lambda/(4\times n)$, which is an optimum value for achieving high reflectivity of the distributed Bragg reflection structure. Specifically, the thickness WH2 of each semiconductor wall and the distance WL of the low-refractive-index portion are set to a value of $\lambda/(4\times n)$ or $3\times\lambda/(4\times n)$. Hereafter, the former is referred to as a $\lambda/(4\times n)$ structure and the latter is referred to as a $3\times\lambda/(4\times n)$ structure. FIG. 3A shows the specific values of WH2 and WL in the $\lambda/(4\times n)$ structure and the $3\times\lambda/(4\times n)$ structure. Herein, $\lambda$ is 7.54 µm as described in (1). The refractive index n in the high-refractive-index portion is 3.098 (refractive index of Fe—InP at a wavelength of 7.54 µm) and the refractive index n in the low-refractive-index portion is 1 because the low-refractive-index portion is an air layer. Under these conditions, the effective reflectivity of the distributed Bragg reflection structure is calculated using a multilayer reflection model based on the plane wave approximation. FIGS. 3B to 3E show the calculation results. FIGS. 3B, 3C, 3D, and 3E are calculation results obtained when the thickness WH1 of the covering semiconductor wall is 0 µm (without covering semiconductor wall), 0.3 µm, 0.6 µm, and 0.9 µm, respectively. The characteristic lines (1), (2), (3), and (4) in the drawings show the calculation results of the following structures.

Model of characteristic line (1): The distance WL between the semiconductor walls (width of low-refractive-index portion) and the thickness WH2 of the semiconductor wall are each $\lambda/(4\times n)$, and the distributed Bragg reflection structure includes two semiconductor walls.

Model of characteristic line (2): The distance WL and the thickness WH2 are each $\lambda/(4\times n)$, and the distributed Bragg reflection structure includes one semiconductor wall.

Model of characteristic line (3): The distance WL and the thickness WH2 are each $3\times\lambda/(4\times n)$, and the distributed Bragg reflection structure includes two semiconductor walls.

Model of characteristic line (4): The distance WL and the thickness WH2 are each $3\times\lambda/(4\times n)$, and the distributed Bragg reflection structure includes one semiconductor wall.

In other words, the characteristic lines (1) and (2) show the calculation results of the $\lambda/(4\times n)$ structure and the characteristic lines (3) and (4) show the calculation results of the $3\times\lambda/(4\times n)$ structure.

FIG. 3B shows the calculation result of WH1=0, that is, the case where the distributed Bragg reflection structure does not include the covering semiconductor wall 17a (19a). In this case, the end facets of the laser main body are the end facets 15a and 15b of the stacked semiconductor layer 15. The calculation is conducted on the basis of the assumption that these end facets have ideal verticality and flatness as with the end facets 25a and 25b of the covering semiconductor wall 17a (19a). Therefore, the difference between FIG. 3B and FIGS. 3C to 3E shows a variation in the reflectivity of the distributed Bragg reflection structures with or without the covering semiconductor wall 17a (19a). As a result of the comparison of FIG. 3B with FIGS. 3C, 3D, and 3E, the addition of the covering semiconductor wall does not considerably change the reflection characteristics of the distributed Bragg reflection structure. Therefore, substantially the same good reflection characteristics are achieved regardless of whether the covering semiconductor wall is included or not. Even if the covering semiconductor wall is included, the reflection characteristics of the distributed Bragg reflection structure do not degrade. Furthermore, the calculation results in FIGS. 3B to 3E are also substantially the same. Thus, it is confirmed that the variation in the effective reflectivity of the distributed Bragg reflection structure in response to the variation in the thickness (WH1) of the covering semiconductor wall is also small.

The calculation results show that even if the thickness WH1 of the covering semiconductor wall is increased to 0.9 µm, the effective reflectivity of the distributed Bragg reflection structure substantially does not vary. However, if the thickness WH1 of the covering semiconductor wall is excessively increased, an influence of the diffraction loss generated by the spatial diffusion of light in the covering semiconductor wall should also be examined. Consequently, the reflectivity of the distributed Bragg reflection structure decreases due to the diffraction loss. To avoid the influence of the diffraction loss, the thickness of the covering semiconductor wall is preferably decreased. The thickness WH1 of the covering semiconductor wall is preferably 0.5 µm or more in view of workability. The thickness WH1 is preferably 5.0 µm or less to avoid the influence of the diffraction loss. As is clear from the calculation results, the distributed Bragg reflection structure including two semiconductor walls has a reflectivity of about 98% regardless of the $\lambda/(4\times n)$ structure or the $3\times\lambda/(4\times n)$ structure. The distributed Bragg reflection structure including one semiconductor wall has a reflectivity of about 87%. In general, the cleaved end facet of a semiconductor layer has a reflectivity of about 30%. Thus, the reflectivity of a distributed Bragg reflection structure is increased to three times or more the reflectivity of a cleaved end facet.

As is understood from the results in FIGS. 3A to 3E, the $\lambda/(4\times n)$ structure has a wide wavelength band that achieves high reflectivity compared with the $3\times\lambda/(4\times n)$ structure. However, since the thickness of the semiconductor wall of the $\lambda/(4\times n)$ structure is 0.6085 µm, it is difficult to form a semiconductor wall having such a submicron width in the actual production process with high precision. On the other hand, the thickness of the semiconductor wall of the $3\times\lambda/(4\times n)$ structure is 1.886 µm, at which the semiconductor wall is easily formed using a typical etching apparatus without problems. Therefore, the semiconductor wall of the $3\times\lambda/(4\times n)$ structure is more easily produced than that of the $\lambda/(4\times n)$ structure.

In the quantum cascade laser according to this embodiment, the distributed Bragg reflection structure exhibits high reflectivity and the threshold current of the quantum cascade laser is decreased. Furthermore, since the semiconductor walls and the covering semiconductor wall of the distributed Bragg reflection structure are made of a single semiconductor material, desired verticality may be imparted to etched sidewalls. In addition, it is not necessary to determine different etching conditions for each semiconductor layer, and productivity is improved.

Second Embodiment

A method for producing a quantum cascade laser will be described with reference to FIG. 4A to FIG. 12E. In FIG. 4A to FIG. 12E, FIGS. 4A, 5A, 6A, 7A, 8A, 9A, 10A, 11A, and 12A are sectional views in a stacked semiconductor layer to be a laser main body, the sectional views being taken along a line (for example, in FIG. 4A, line IVa-IVa of FIG. 4D) perpendicular to a direction in which an optical waveguide extends. FIGS. 4B, 5B, 6B, 7B, 8B, 9B, 10B, 11B, and 12B are sectional views in a covering semiconductor wall of a distributed Bragg reflection structure, the sectional views being taken along a line (for example, in FIG. 4B, line IVb-IVb of FIG. 4D) perpendicular to a direction in which an optical waveguide extends. FIGS. 4C, 5C, 6C, 7C, 8C, 9C, 10C, 11C, and 12C are sectional views in a semiconductor wall of a distributed Bragg reflection structure, the sectional views being taken along a line (for example, in FIG. 4C, line IVc-IVc of FIG. 4D) perpendicular to a direction in which an optical waveguide extends. FIGS. 4D, 5D, 6D, 7D, 8D, 9D, 10D, 11D, and 12D are sectional views illustrating an optical waveguide, the sectional views being taken along a line (for example, in FIG. 4D, line IVd-IVd of FIG. 4A) that extends in a direction in which the optical waveguide extends. FIGS. 4E, 5E, 6E, 7E, 8E, 9E, 10E, 11E, and 12E are sectional views illustrating a current blocking semiconductor region, the sectional views being taken along a line (for example, in FIG. 4E, line IVe-IVe of FIG. 4A) that extends in a direction in which an optical waveguide extends.

As illustrated in FIGS. 4A to 4E, an epitaxial semiconductor region 43 is grown on a substrate 41 by using a metal-organic vapor phase epitaxy (MOVPE) method or a molecular beam epitaxial growth (MBE) method, for example. In this embodiment, the epitaxial semiconductor region 43 includes an n-type lower cladding layer 45, a core layer 47, an n-type upper cladding layer 49, and a contact layer 51. After the crystal growth, a mask 53 having a pattern that defines a planar shape of a stacked semiconductor layer of the quantum cascade laser is formed on the epitaxial semiconductor region 43 (in this embodiment, on the contact layer 51) as illustrated in FIGS. 4A and 4D. The mask 53 has a pattern on a second region 41b of the substrate 41 and also has openings on a first region 41a and a third region 41c of the substrate 41. The mask 53 is formed by forming an insulating layer and then patterning the insulating layer by a photolithography method and an etching method. The insulating layer is a dielectric film made of SiN, SiON, alumina, or $SiO_2$, for example.

The substrate 41 and the epitaxial semiconductor region 43 are etched using the mask 53 to form a stripe-shaped stacked semiconductor layer 55 in the second region 41b of the substrate 41 as illustrated in FIGS. 5A to 5E. The stacked semiconductor layer 55 is a region to be formed into a mesa waveguide. The stacked semiconductor layer 55 has end facets 55a and 55b. The stacked semiconductor layer 55 includes an n-type lower cladding layer 45a, a core layer 47a, an n-type upper cladding layer 49a, and an n-type contact layer 51a. The n-type lower cladding layer 45a, the core layer 47a, the n-type upper cladding layer 49a, and the n-type contact layer 51a have a stripe shape. This etching may be performed by wet etching or dry etching. In order to control the width of the mesa waveguide constituted by the stacked semiconductor layer 55 with high precision, dry etching which is suitable for vertical etching is desirably employed. A reactive ion etching (RIE) method is used as an example of the dry etching method.

Subsequently, as illustrated in FIGS. 6A to 6E, a buried layer is selectively grown on a side surface of the stripe-shaped stacked semiconductor layer 55 and on the exposed surface of the substrate 41 while remaining the mask 53 on the stripe-shaped stacked semiconductor layer 55 in the second region 41b of the substrate 41. The mask 53 is used for a selective growth mask. In the growth of the buried layer, the buried layer is not grown on the pattern of the mask 53. In the embodiment, the buried layer 57 made of, for example, a semi-insulating semiconductor is grown on the substrate 41 and on the side surfaces and end facets 55a and 55b of the stacked semiconductor layer 55 so as to embed the stacked semiconductor layer 55. As a result, a semi-insulating semiconductor is grown so as to be in contact with the side surfaces and end facets 55a and 55b of the stacked semiconductor layer 55. Consequently, the stacked semiconductor layer 55 is embedded by the buried layer 57. In this embodiment, the buried layer 57 is grown to the height of the upper surface of the stacked semiconductor layer 55. Therefore, as illustrated in FIG. 6D, the distance H1 between the upper surface of the buried layer 57 and the back surface of the substrate is substantially equal to the distance H2 between the upper surface of the stacked semiconductor layer 55 and the back surface of the substrate. The end facets 55a and 55b of the stacked semiconductor layer 55 are covered with the buried layer 57 made of, for example, a semi-insulating semiconductor.

Figure 7A:
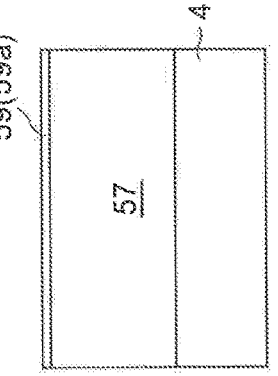
FIGS. 7A to 7E are sectional views illustrating a main process in the method for producing a quantum cascade laser according to the second embodiment.
Figure 7B:
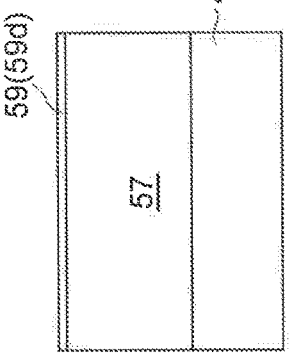
Figure 7C:
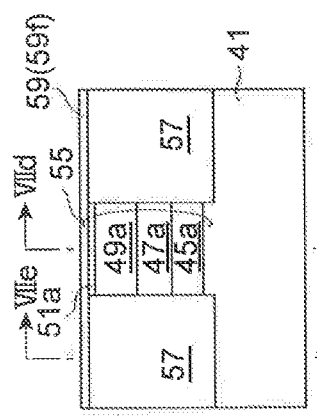
Figure 7D:
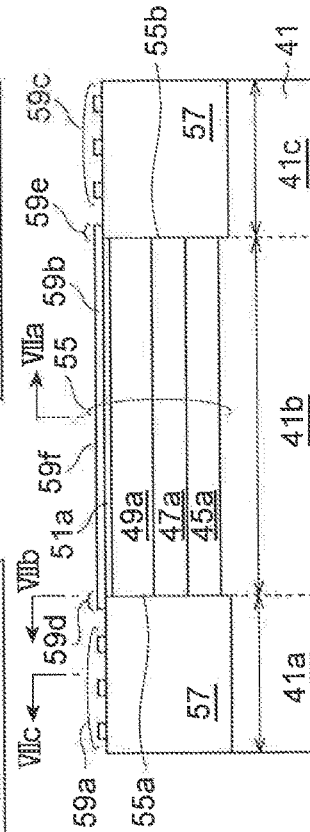
Figure 7E:
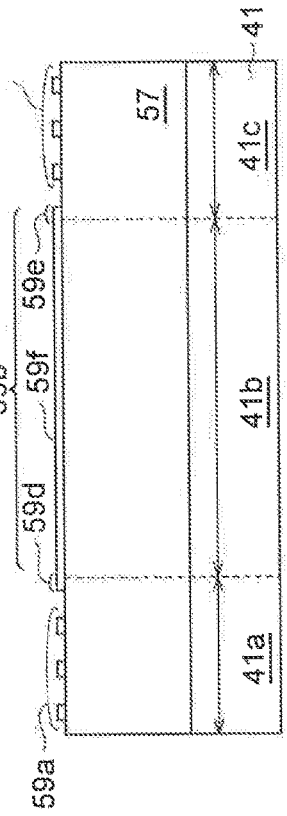
Figure 8A:
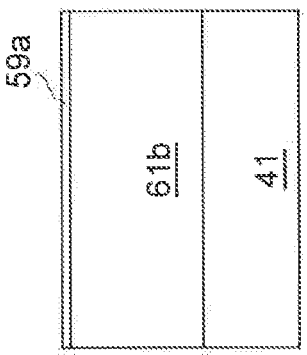
FIGS. 8A to 8E are sectional views illustrating a main process in the method for producing a quantum cascade laser according to the second embodiment.
Figure 8B:
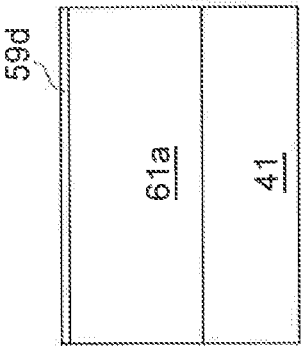
Figure 8C:
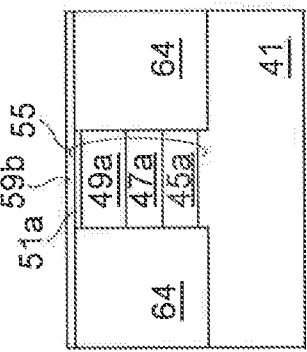
Figure 8D:
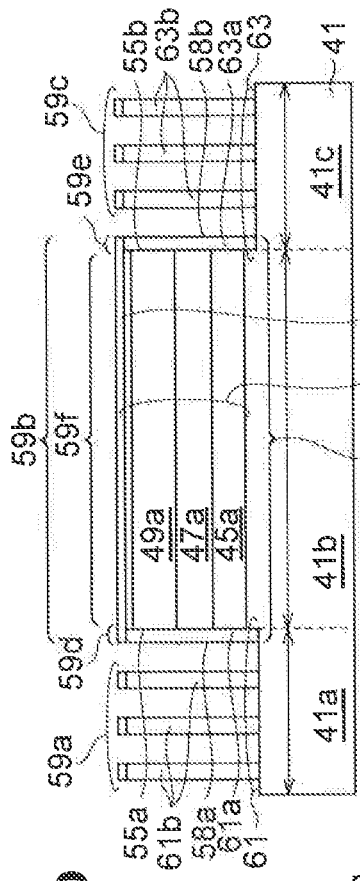
Figure 8E:
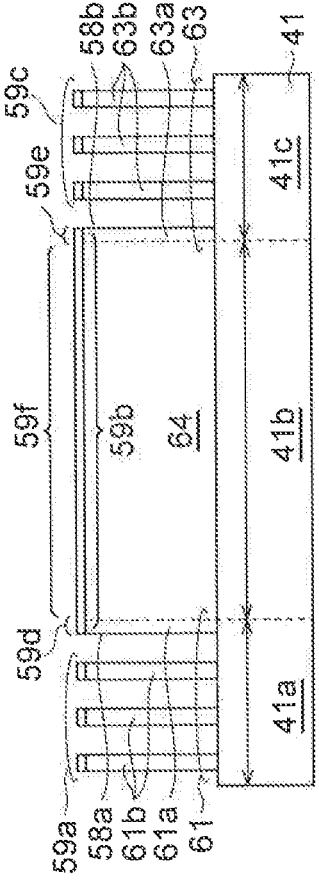

After the regrowth process of the buried layer, the mask 53 is removed. Subsequently, as illustrated in FIGS. 7A to 7E, a mask 59 for forming a distributed Bragg reflection structure is formed on the upper surface of the buried layer 57 and the upper surface of the stacked semiconductor layer 55. The mask 59 includes a first pattern 59a and a third pattern 59c for forming semiconductor walls constituting a diffraction grating, in the first region 41a and the third region 41c of the substrate 41, respectively. The mask 59 also includes a second pattern 59b in the second region 41b of the substrate 41. As illustrated in FIG. 7D, the second pattern 59b includes a first extending portion 59d and a second extending portion 59e that extend along a first axis Ax1, and a covering portion 59f that covers the entire upper surface of the stacked semiconductor layer 55. The distance of the first extending portion 59d and the second extending portion 59e that extend along the first axis Ax1 defines the thickness of the covering semiconductor wall which covers the end facet of the stacked semiconductor layer 55.

As illustrated in FIGS. 8A to 8E, the buried layer 57 is etched using the mask 59. Thus, a distributed Bragg reflection structure 61 is formed in the first region 41a of the substrate 41. A current blocking layer 64 is formed in the second region 41b of the substrate 41. A distributed Bragg reflection structure 63 is formed in the third region 41c of the substrate 41. As a result of the etching, the distributed Bragg reflection structure 61 (63) includes a covering semiconductor wall 61a (63a) that covers the end facet 55a (55b) of the stacked semiconductor layer 55 and semiconductor walls 61b (63b). As described above, the etched surfaces of the covering semiconductor wall 61a (63a) and the semiconductor walls 61b (63b) need to have high verticality. Therefore, dry etching which is suitable for vertical etching is employed. Specifically, a reactive ion etching (RIE) method is used as the dry etching method. The stacked semiconductor layer 55, the current blocking layer 64, and the covering semiconductor wall 61a (63a) constitute a laser structure 58 serving as a laser main body left as an integrated semiconductor. The laser structure 58 has end facets 58a and 58b (first end facet 25a and second end facet 25b) that intersect the first axis Ax1. The covering semiconductor walls 61a and 63a provide the end facets 58a and 58b of the laser structure 58, respectively.

After the dry etching, the mask 59 is removed. Then, a mask for forming an insulating layer is formed. As illustrated in FIGS. 9A to 9E, an insulating layer 65 is formed on the entire surface of the substrate. The insulating layer 65 is a dielectric film made of SiN, SiON, alumina, or $SiO_2$, for example. Subsequently, as illustrated in FIGS. 9A to 9E, the insulating layer 65 on the current blocking layer 64 is partially covered with a resist mask 67. The resist mask 67 has a first opening located on the upper surface of the stacked semiconductor layer 55 and a second opening located on the distributed Bragg reflection structure 61 (63).

As illustrated in FIGS. 10A to 10E, the insulating layer 65 is etched using the resist mask 67 to form an insulating layer 69 as a protection film. This etching may be performed by a dry etching method or a wet etching method. As a result, the insulating layer in the openings of the resist mask 67 is removed. Consequently, the insulating layer 69 is left on the current blocking layer 64 composed of the semi-insulating semiconductor layer.

After forming the insulating layer 69 on the current blocking layer 64, a resist mask 71 for forming an upper electrode is formed as illustrated in FIGS. 11A to 11E. The resist mask 71 is formed by photolithography. The resist mask 71 has an opening on the upper surface of the laser structure 58. After forming the resist mask 71, a metal layer 73 for forming an upper electrode is formed on the entire surface of the substrate as illustrated in FIGS. 11A to 11E. The formation of the metal layer 73 is performed by using an evaporation method or a sputtering method. The metal layer 73 includes a first portion 73a deposited on the pattern of the resist mask 71 and a second portion 73b deposited in the opening of the resist mask 71. After the formation of the metal layer 73, lift-off is performed. Thus, as illustrated in FIGS. 12A to 12E, the first portion 73a of the metal layer 73 on the resist mask 71 is selectively removed while the second portion 73b of the metal layer 73 is left as an upper electrode 75a on the upper surface of the laser structure 58. Then, the back surface of the substrate 41 is polished to an appropriate thickness for cleavage (in the embodiment, about 100 μm). Subsequently, a backside electrode 75b is formed on the polished surface 41d of the substrate 41. When necessary, the low-refractive-index portion of the distributed Bragg reflection structure 61 (63) may be an embedded region. The embedded region is filled with a material having a refractive index lower than that of a semiconductor of the high-refractive-index portion.

Through these steps, a substrate product SP for quantum cascade lasers is completed. A laser chip is produced from the substrate product SP.

In this production method, since the distributed Bragg reflection structure is made of a single semiconductor material, semiconductor walls and a covering semiconductor wall having the side surfaces with good planarity and verticality are formed. Furthermore, since the current confinement structure and the distributed Bragg reflection structure are made of the same single semiconductor material, they are formed at a time by single regrowth and etching. The semiconductor material for the current confinement structure and the distributed Bragg reflection structure is not limited to a semi-insulating semiconductor, and may be, for example, an undoped semiconductor.

Third Embodiment

FIG. 13A illustrates a quantum cascade laser 11a. The quantum cascade laser 11a includes a distributed Bragg reflection structure 81 (83) instead of the distributed Bragg reflection structure 17 (19) of the quantum cascade laser 11. The distributed Bragg reflection structure 81 (83) includes a covering semiconductor wall 81a (83a) that covers the end facet 15a (15b) of the stacked semiconductor layer 15 and one or more semiconductor walls 81b (83b). The covering semiconductor wall 81a (83a) and the semiconductor walls 81b (83b) are arranged along the first axis Ax1 to constitute the distributed Bragg reflection structure 81 (83). The distance D3 between the upper ends of the semiconductor walls 81b (83b) and the back surface of the substrate 13 is larger than the distance D2 between the upper surface of the stacked semiconductor layer 15 and the back surface of the substrate 13. In the embodiment, the distance between the upper ends of the covering semiconductor wall 81a (83a) and the back surface of the substrate 13 is substantially equal to the distance D3 between the upper ends of the semiconductor walls 81b (83b) and the back surface of the substrate 13. In other words, the covering semiconductor wall 81a (83a) and the semiconductor walls 81b (83b) are extended in the Ax2 direction with a predetermined distance so that light emitted from the core layer 21b in the stacked semiconductor layer 15 is almost completely reflected at the distributed Bragg reflection structure 81 (83) in consideration of the divergence angle of light. Accordingly, when the distributed Bragg reflection structure 81 (83) is used, high reflection is easily achieved at the end facet. This structure may be formed by the same production method as in the first embodiment, except that, in the region to be a distributed Bragg reflection structure in FIGS. 6A to 6E, the buried layer 57 is regrown so that the uppermost surface of the single semiconductor layer formed during the regrowth is located higher than the uppermost surface of the stacked semiconductor layer 55 in the laser main body region.

FIG. 13B illustrates a quantum cascade laser 11b. The quantum cascade laser 11b includes a distributed Bragg reflection structure 82 (84) which is slightly modified from the distributed Bragg reflection structure 81 (83) of the quantum cascade laser 11l a and which includes the covering semiconductor wall 17a (19a) and the semiconductor walls 81b (83b). In this structure, the distance D3 between the upper end of the semiconductor walls 81b (83b) and the back surface of the substrate 13 is larger than the distance D2 between the upper surface of the stacked semiconductor layer 15 and the back surface of the substrate 13. The distance D1 between the upper end of the covering semiconductor wall 17a (19a) and the back surface of the substrate 13 is substantially equal to the distance D2. Also in this structure, as in FIG. 13A, the semiconductor walls 81b (83b) of the distributed Bragg reflection structure 82 (84) are extended in the Ax2 direction with a predetermined distance so that light emitted from the core layer 21b in the stacked semiconductor layer 15 is almost completely reflected at the distributed Bragg reflection structure 82 (84) in consideration of the divergence angle of light. Accordingly, when the distributed Bragg reflection structure 82 (84) is used, high reflection is easily achieved at the end facet.

Fourth Embodiment

Figure 14:
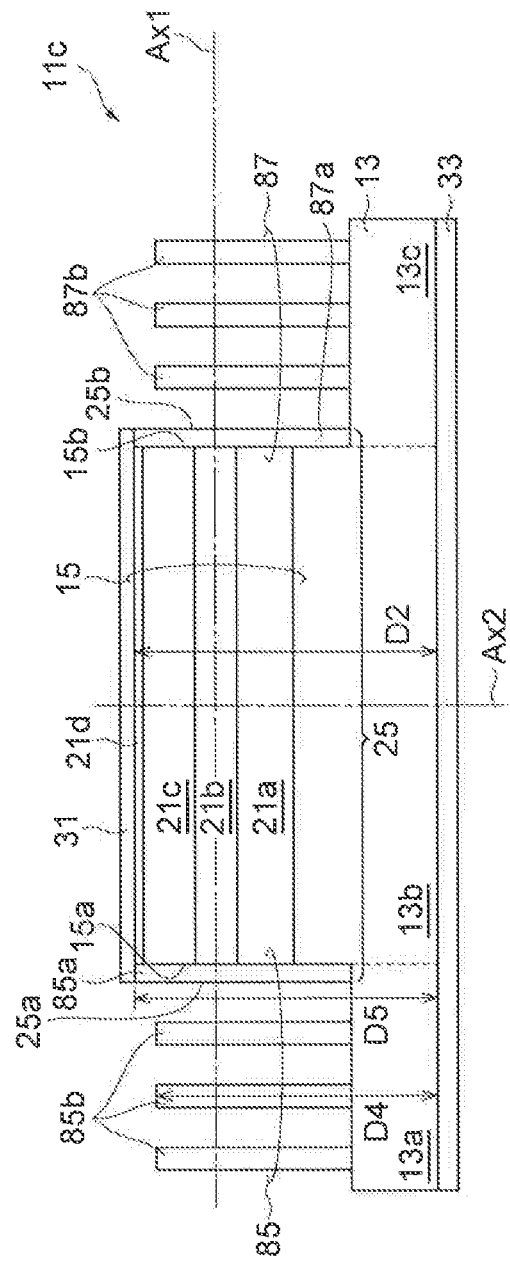
FIG. 14 schematically illustrates a quantum cascade laser according to a fourth embodiment.

FIG. 14 illustrates a quantum cascade laser 11c. The quantum cascade laser 11c includes a distributed Bragg reflection structure 85 (87) instead of the distributed Bragg reflection structure 17 (19) of the quantum cascade laser 11. The distributed Bragg reflection structure 85 (87) includes a covering semiconductor wall 85a (87a) that covers the end facet 15a (15b) of the stacked semiconductor layer 15 and one or more semiconductor walls 85b (87b). The covering semiconductor wall 85a (87a) and the semiconductor walls 85b (87b) are arranged along the first axis Ax1 to constitute the distributed Bragg reflection structure 85 (87). The distance D4 between the upper end of the semiconductor walls 85b (87b) and the back surface of the substrate 13 is smaller than the distance D5 between the upper end of the covering semiconductor wall 85a (87a) and the back surface of the substrate 13. More specifically, the distance D5 between the upper end of the covering semiconductor wall 85a (87a) and the back surface of the substrate 13 is substantially equal to the distance D2 between the upper surface of the stacked semiconductor layer 15 and the back surface of the substrate 13. However, the distance D4 between the upper end of the semiconductor walls 85b (87b) and the back surface of the substrate 13 is smaller than the distance D2 between the upper surface of the stacked semiconductor layer 15 and the back surface of the substrate 13. This structure may be formed by the same production method as in the first embodiment, except that, in FIGS. 6A to 6E, after the buried layer 57 composed of the single semiconductor layer is grown, only an upper portion of the buried layer 57 in a region where a distributed Bragg reflection structure is to be formed is etched. Since the covering semiconductor wall 85a (87a) covers the entire end facet 15a (15b) of the stacked semiconductor layer 15 to protect the end facet 15a (15b), the degradation due to oxidation of the end facet 15a (15b) is avoided. The reflectivity in the distributed Bragg reflection structure 85 (87) is smaller than that of the distributed Bragg reflection structure 17 (19) of the quantum cascade laser 11. However, by adjusting the distance D4, the high effective reflectivity in the distributed Bragg reflection structure 85 (87) is obtained. In addition, in this embodiment, the etching depth required to form the semiconductor walls 85b (87b) is small. Therefore, the semiconductor walls 85b (87b) is processed in a small etching amount. This structure contributes to an improvement in the processing accuracy for the semiconductor walls 85b (87b).

Fifth Embodiment

Referring to FIG. 15A, the quantum cascade laser 11c is mounted in an epi-down configuration on a sub-mount 89 including a heatsink through a solder material 88, for example. In mounting the quantum cascade laser chip in the epi-down configuration, the upper electrode 31 on the stacked semiconductor layer 15 is supported by the sub-mount 89 through the solder material 88. Therefore, the semiconductor walls 85b (87b) having a relatively small thickness are not directly supported by the sub-mount 89. Thus, the quantum cascade laser chip is mounted on the sub-mount 89 without bringing the semiconductor walls 85b (87b) into contact with the solder material 88 or the sub-mount 89. Accordingly, the physical damage to the semiconductor walls 85b (87b) during mounting the quantum cascade laser chip is avoided. The solder material may be, for example, In or AuSn. The sub-mount may be made of, for example, Cu, diamond, or AlN. A difference between the distance D2 and the distance D4 is set to be from 0.1 μm to 5 μm, for example.

Referring to FIG. 15B, the quantum cascade laser 11b is mounted in an epi-up configuration on a sub-mount 89 including a heatsink through a solder material 88. In this epi-up mounting configuration, the backside electrode 33 of the quantum cascade laser 11b is in contact with the solder material 88 on the sub-mount 89. This epi-up mounting configuration may be applied not only to the quantum cascade laser 11b but also to the quantum cascade lasers 11a and 11c.

Sixth Embodiment

Figures 16A, 16B:
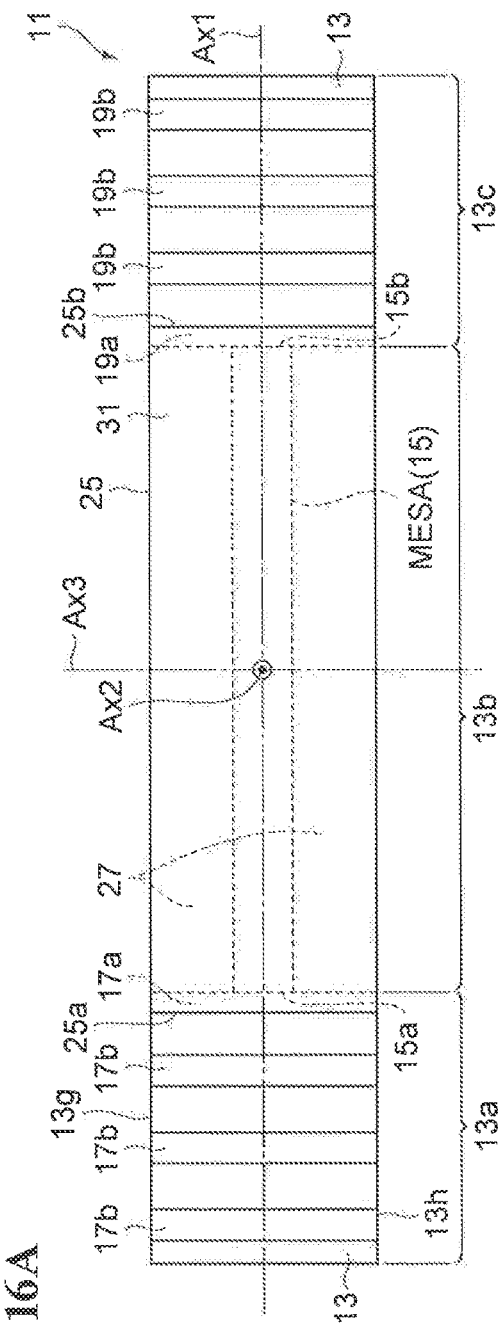
FIGS. 16A and 16B schematically illustrate quantum cascade lasers according to a sixth embodiment.

FIG. 16A is a plan view of the quantum cascade laser 11 illustrated in FIG. 1 and FIG. 2. In FIG. 16A, the upper surface of the laser structure 25 is covered with the upper electrode 31. Therefore, the semiconductor mesa waveguide MESA is indicated by a broken line. In the quantum cascade laser 11, the covering semiconductor wall 17a (19a) extends along a third axis Ax3 that intersects the first axis Ax1 and the second axis Ax2, from an upper edge of one side surface 13g of the substrate 13 to an upper edge of the other side surface 13h. Thus, the covering semiconductor wall 17a (19a) thoroughly covers the end facets 15a and 15b. The semiconductor walls 17b (19b) extend along the third axis Ax3 from an upper edge of one surface 13g of the substrate 13 to an upper edge of the other side surface 13h. Furthermore, the semiconductor walls 17b (19b) are periodically arranged along the first axis Ax1 so as to form a distributed Bragg reflection structure together with the covering semiconductor wall 17a (19a) of the laser structure 25.

As illustrated in FIG. 16B, in a quantum cascade laser 11d, the distributed Bragg reflection structure 17 (19) may further include a first connecting portion 17c (19c). The first connecting portion 17c (19c) extends along the first axis Ax1 and connects ends of a plurality of semiconductor walls 17b (19b) to each other. The first connecting portion 17c (19c) extends along the upper edge of one side surface 13g of the substrate 13. In this quantum cascade laser 11d, the first connecting portion 17c (19c) connects the semiconductor walls 17b (19b) so as to integrate the first connecting portion 17c (19c) and the semiconductor walls 17b (19b). The first connecting portion 17c (19c) increases the mechanical strength of the distributed Bragg reflection structure 17 (19). As a result, the production yield of the quantum cascade laser 11d is improved. The durability of the quantum cascade laser 11d is also improved.

The distributed Bragg reflection structure 17 (19) may further include a third connecting portion 17d (19d). The third connecting portion 17d (19d) extends along the first axis Ax1 and connects the other ends of the semiconductor walls 17b (19b) to each other. The first connecting portion 17c (19c) and the third connecting portion 17d (19d) each have a shape of a connecting wall, which allows structural reinforcement. The third connecting portion 17d (19d) also increases the mechanical strength of the distributed Bragg reflection structure 17 (19) which makes it difficult to damage the distributed Bragg reflection structure 17 (19). In the quantum cascade laser 11d illustrated in FIG. 16B, the first connecting portion 17c (19c) and the third connecting portion 17d (19d) connect all the semiconductor walls 17b (19b), but may connect some of the plurality of semiconductor walls 17b (19b).

The first connecting portion 17c (19c) and the third connecting portion 17d (19d) are preferably made of the same material as that of the semiconductor walls 17b (19b). According to the quantum cascade laser 11d, the semiconductor walls 17b (19b), the first connecting portion 17c (19c), and the third connecting portion 17d (19d) are made of the same semiconductor material. Thus, the strength of the distributed Bragg reflection structure 17 (19) is improved. Furthermore, since the semiconductor walls 17b (19b), the first connecting portion 17c (19c), and the third connecting portion 17d (19d) are made of the same material, the growth process and working process may be performed at a time.

Seventh Embodiment

Figure 17:
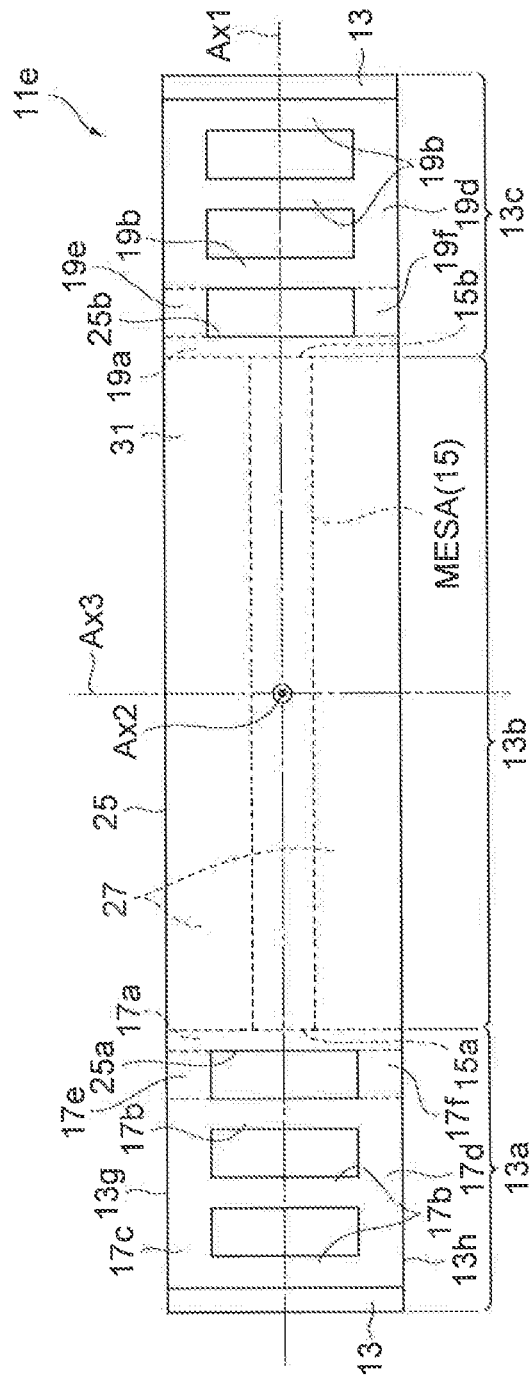
FIG. 17 schematically illustrates a quantum cascade laser according to a seventh embodiment.

In a quantum cascade laser 11e illustrated in FIG. 17, the distributed Bragg reflection structure 17 (19) may further include a second connecting portion 17e (19e). The second connecting portion 17e (19e) connects one of the semiconductor walls 17b (19b) and the covering semiconductor wall 17a (19a) of the laser structure 25. The second connecting portion 17e (19e) extends along the first axis Ax1. In this quantum cascade laser 11e, the second connecting portion 17e (19e) connects the covering semiconductor wall 17a (19a) of the laser structure 25 to the semiconductor wall 17b (19b) so as to integrate the second connecting portion 17e (19e), the semiconductor wall 17b (19b), and the covering semiconductor wall 17a (19a). Therefore, the second connecting portion 17e (19e) increases the mechanical strength of the distributed Bragg reflection structure 17 (19). In FIG. 17, the quantum cascade laser 11e includes the first connecting portion 17c (19c) in addition to the second connecting portion 17e (19e). However, the first connecting portion 17c (19c) is not necessarily included.

The distributed Bragg reflection structure 17 (19) may further include a fourth connecting portion 17f (19f). The fourth connecting portion 17f (19f) connects the covering semiconductor wall 17a (19a) of the laser structure 25 and one of the semiconductor walls 17b (19b). The fourth connecting portion 17f (19f) extends along the first axis Ax1. The fourth connecting portion 17f(19f) increases the mechanical strength of the distributed Bragg reflection structure 17 (19). In FIG. 17, the quantum cascade laser 11e includes the third connecting portion 17d (19d) in addition to the fourth connecting portion 17f(19f). However, the third connecting portion 17d (19d) is not necessarily included.

The second connecting portion 17e (19e) and the fourth connecting portion 17f(19f) are preferably made of the same material as the semiconductor walls 17b (19b). According to the quantum cascade laser 11e, the semiconductor wall 17b (19b), the second connecting portion 17e (19e), and the fourth connecting portion 17f (19f) are connected to each other. Therefore, the strength of the distributed Bragg reflection structure 17 (19) is improved. Furthermore, since the semiconductor wall 17b (19b), the second connecting portion 17e (19e), and the fourth connecting portion 17f (19f) are made of the same material, the semiconductor growth and processing for them can be performed at a time and the production process for the distributed Bragg reflection structure can be simplified.

The second connecting portion 17e (19e) and the fourth connecting portion 17f (19f) are preferably made of the same material as the semiconductor walls 17b (19b) and the covering semiconductor wall 17a (19a). According to the quantum cascade laser 11e, the covering semiconductor wall 17a (19a), the semiconductor wall 17b (19b), the second connecting portion 17e (19e), and the fourth connecting portion 17f (19f) are connected to each other, and thus are constituted as a uniform structure in terms of material. Therefore, the strength of the distributed Bragg reflection structure 17 (19) is improved. Furthermore, since the covering semiconductor wall 17a (19a), the semiconductor wall 17b (19b), the second connecting portion 17e (19e), and the fourth connecting portion 17f (19f) are made of the same material, the growth process and working process may be performed at a time.

Eighth Embodiment

Figure 18:
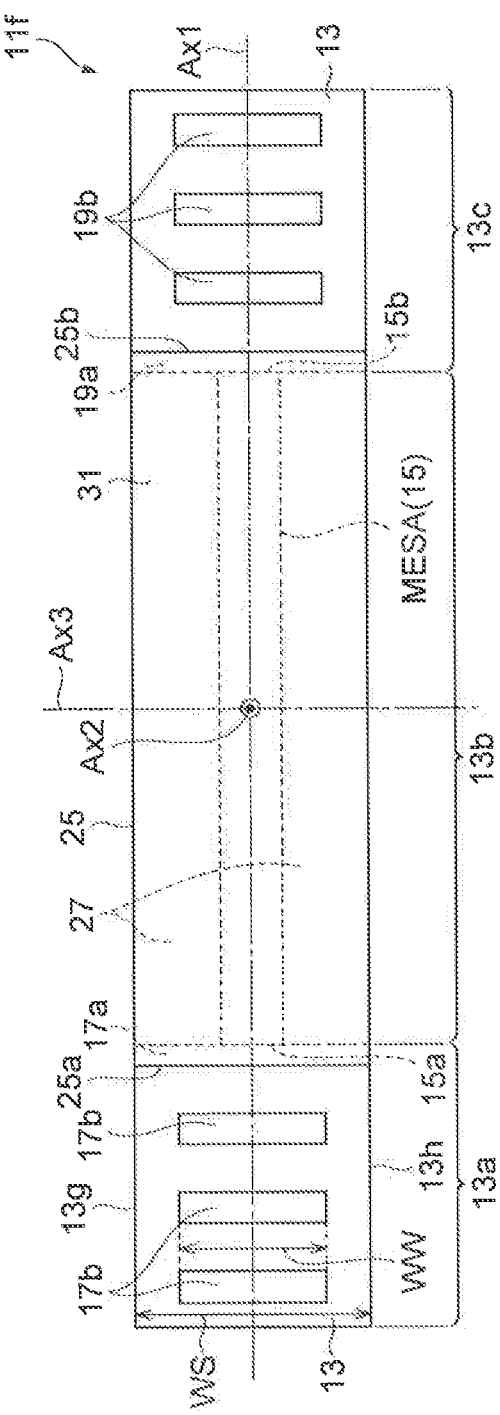
FIG. 18 schematically illustrates a quantum cascade laser according to an eighth embodiment.

In a quantum cascade laser 11f illustrated in FIG. 18, the semiconductor walls 17b (19b) have a wall width WW along the third axis Ax3. The substrate 13 has a substrate width WS along the third axis Ax3. In this embodiment, the left and right ends of each of the semiconductor walls 17b (19b) are located away from the upper edge of one side surface 13g of the substrate 13 and the upper edge of the other side surface 13h. In the quantum cascade laser 11f, the wall width WW is smaller than the substrate width WS. According to this quantum cascade laser 11f, an ununiformity in etching rate in a wafer due to a micro-loading effect described later is reduced during forming the semiconductor walls 17b (19b) by dry etching. Therefore, the in-plane uniformity and reproducibility of etching may be improved.

Ninth Embodiment

Figure 19A:
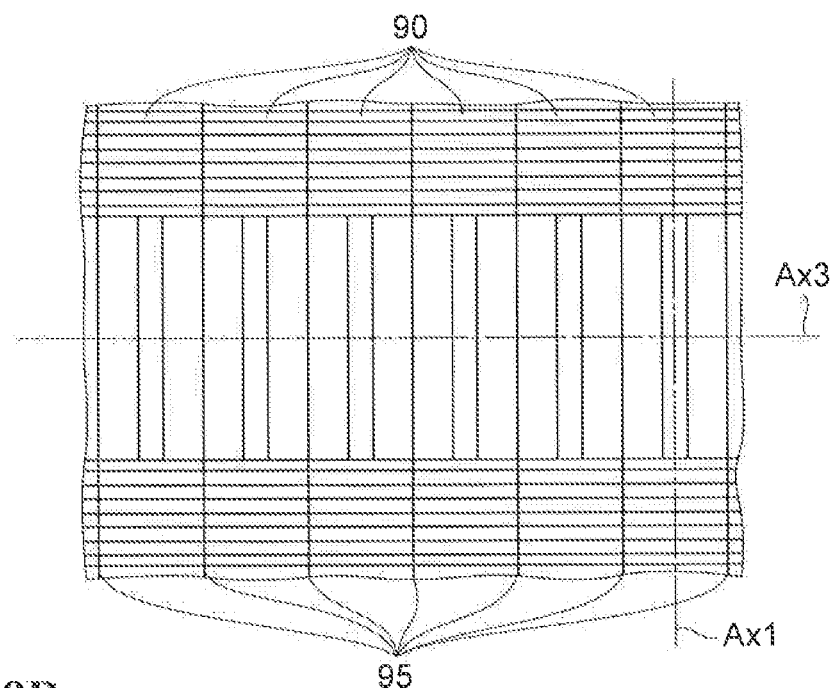
FIGS. 19A and 19B schematically illustrate quantum cascade lasers according to a ninth embodiment.
Figure 19B:
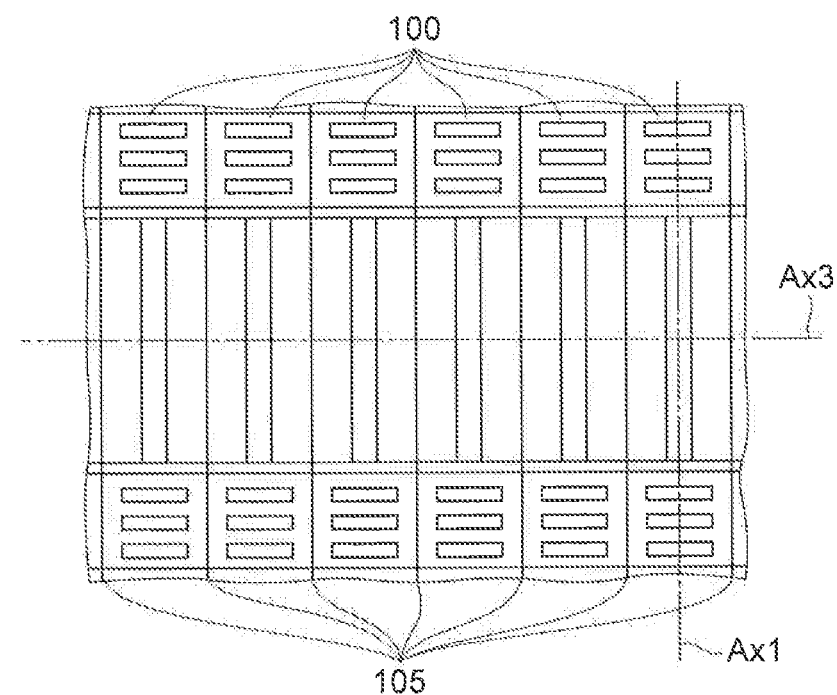

In the production of the quantum cascade laser illustrated in FIG. 4A to FIG. 12E, many quantum cascade lasers arranged in many element sections are simultaneously formed on a wafer to complete the above-described substrate product SP. Subsequently, the substrate product SP is divided into individual semiconductor laser chips. FIG. 19A illustrates the substrate product SP of the quantum cascade laser 11. Referring to FIG. 19A, six element sections 90 for forming the quantum cascade lasers 11 are illustrated. FIG. 19B illustrates the substrate product SP of the quantum cascade laser 11f Referring to FIG. 19B, six element sections 100 for forming the quantum cascade lasers 11f are illustrated.

In FIG. 19A, semiconductor walls to constitute the distributed Bragg reflection structure 17 (19) are connected to each other across the boundaries 95 of the element sections. On the other hand, in FIG. 19B, semiconductor walls to constitute the distributed Bragg reflection structure 17 (19) are away from the boundaries 105 of the element sections. Here, the boundaries 105 extend along the first axis Ax1. Therefore, the semiconductor walls are not present at the boundaries 105 of the element sections. Therefore, when the semiconductor walls 17b (19b) are formed by using a dry etching method, the stagnation of gas caused by the semiconductor walls is reduced in the substrate product SP of the quantum cascade lasers 11f illustrated in FIG. 19B compared with the substrate product SP of the quantum cascade lasers 11 illustrated in FIG. 19A. Thus, the etching gas easily flows along the first axis Ax1 and the third axis Ax3 in the substrate product SP illustrated in FIG. 19B. Consequently, the etching gas is circulated well, and the variation in etching rate due to a micro-loading effect in the in-plane directions of the substrate is reduced in the substrate product SP illustrated in FIG. 19B. Accordingly, the in-plane uniformity and reproducibility of etching during the formation of the semiconductor walls 17a (19a) is further improved in the quantum cascade laser 11f than in the quantum cascade laser 11.

As shown in FIG. 19B, the semiconductor walls are not present at the boundaries 105 of the element sections. Therefore, a pressing force is not applied to the semiconductor walls during dividing the substrate product SP into the semiconductor laser chips by pressing the wafer. Therefore, the production yield is not decreased even if a pressing force is applied on the wafer in dividing the substrate product SP into the semiconductor laser chips.

Furthermore, the ratio (WW/H) of the wall width WW of the semiconductor walls 17b (19b) to the height H of the semiconductor walls 17b (19b) along the second axis Ax2 is smaller in the quantum cascade laser 11f than in the quantum cascade laser 11. Therefore, the mechanical strength of the semiconductor walls 17b (19b) may be further improved in the quantum cascade laser 11f than in the quantum cascade laser 11.

Principles of the present invention have been described in the preferred embodiments with reference to the drawings. However, those skilled in the art understand that the present invention can be changed in arrangement and in details without departing from the principles. The present invention is not limited to the specific configurations disclosed in the embodiments. Therefore, the Claims and all the modifications and changes within the spirit of the Claims are claimed as the invention.

What is claimed is:

1. A quantum cascade laser comprising:
   a substrate having a principal surface including a first region and a second region arranged along a first axis;
   a stacked semiconductor layer disposed on the principal surface in the second region of the substrate, the stacked semiconductor layer having an end facet located on a boundary between the first region and the second region of the substrate, the stacked semiconductor layer including a core layer and a cladding layer disposed on the core layer, the core layer and the cladding layer being exposed at the end facet of the stacked semiconductor layer; and
   a distributed Bragg reflection structure disposed on the principal surface in the first region of the substrate, the distributed Bragg reflection structure including a semiconductor wall and a covering semiconductor wall that covers the end facet of the stacked semiconductor layer, the distributed Bragg reflection structure being optically coupled to the end facet of the stacked semiconductor layer,
   wherein the semiconductor wall and the covering semiconductor wall are made of a single semiconductor material,
   the semiconductor wall has a first side surface and a second side surface opposite to the first side surface,
   the first side surface and the second side surface of the semiconductor wall intersect the first axis and extend along a second axis intersecting the principal surface,
   the covering semiconductor wall provides an end facet that intersects the first axis and extends along the second axis, and
   the end facet provided by the covering semiconductor wall is located away from the first side surface and the second side surface of the semiconductor wall.

2. The quantum cascade laser according to claim 1, wherein the stacked semiconductor layer and the covering semiconductor wall of the distributed Bragg reflection structure constitute a laser structure disposed on the first region and the second region of the substrate, and
   the end facet provided by the covering semiconductor wall corresponds to an end facet of the laser structure.

3. The quantum cascade laser according to claim 1, wherein the end facet provided by the covering semiconductor wall and the first and second side surfaces of the semiconductor wall are arranged along the first axis,
   the distributed Bragg reflection structure has a low-refractive-index portion disposed between the end facet provided by the covering semiconductor wall and the first side surface and a high-refractive-index portion disposed between the first side surface and the second side surface,
   the low-refractive-index portion has a thickness along the first axis that is an odd multiple of $\lambda/(4 \times n1)$, and
   the high-refractive-index portion has a thickness along the first axis that is an odd multiple of $\lambda/(4 \times n2)$,
   where "$\lambda$" represents a lasing wavelength in a vacuum, "n1" represents an effective refractive index of the low-refractive-index portion at the lasing wavelength, and "n2" represents an effective refractive index of the high-refractive-index portion at the lasing wavelength.

4. The quantum cascade laser according to claim 1, wherein the distributed Bragg reflection structure includes one or more additional semiconductor walls,
   the distributed Bragg reflection structure further includes a connecting portion that connects the semiconductor wall and a wall of the one or more additional semiconductor walls or that connects walls of the one or more additional semiconductor walls with each other, and
   the connecting portion extends along the first axis.

5. The quantum cascade laser according to claim 4, wherein the connecting portion and the one or more additional semiconductor walls are made of the same semiconductor material as the semiconductor wall.

6. The quantum cascade laser according to claim 1, further comprising a connecting portion that connects the semiconductor wall and the covering semiconductor wall,
   wherein the connecting portion extends along the first axis.

7. The quantum cascade laser according to claim 6, wherein the connecting portion is made of the same semiconductor material as the semiconductor wall.

8. The quantum cascade laser according to claim 6, wherein the semiconductor wall and the covering semiconductor wall are made of the same semiconductor material as the connecting portion.

9. The quantum cascade laser according to claim 1, wherein the semiconductor material constituting the semiconductor wall and the covering semiconductor wall is an undoped semiconductor or a semi-insulating semiconductor.

10. The quantum cascade laser according to claim 1, wherein the semiconductor wall has a top surface that is located higher than a top surface of the stacked semiconductor layer.

11. The quantum cascade laser according to claim 1, wherein the semiconductor wall has a top surface that is located lower than a top surface of the stacked semiconductor layer.

12. The quantum cascade laser according to claim 1, wherein the semiconductor wall has a wall width along a third axis that intersects the first axis and the second axis,
    the substrate has a substrate width along the third axis, and
    the wall width is smaller than the substrate width.

13. The quantum cascade laser according to claim 1, wherein
    the distributed Bragg reflection structure further includes one or more additional semiconductor walls and an embedded region that is disposed between the semiconductor wall and the covering semiconductor wall, between the semiconductor wall and a wall of the one or more additional semiconductor walls, or between walls of the one or more additional semiconductor walls, and the embedded region contains at least one of silicon dioxide, silicon oxy-nitride, silicon nitride, alumina, BCB resin, and polyimide resin.

14. The quantum cascade laser according to claim 1, wherein the distributed Bragg reflection structure further includes one or more additional semiconductor walls and a gap that is disposed between the semiconductor wall and the covering semiconductor wall, between the semiconductor wall and a wall of the one or more additional semiconductor walls, or between walls of the one or more additional semiconductor walls.

* * * * *